US011815555B2

(12) United States Patent
Liu et al.

(10) Patent No.: US 11,815,555 B2
(45) Date of Patent: Nov. 14, 2023

(54) UNIVERSAL COMPACTOR ARCHITECTURE FOR TESTING CIRCUITS

(71) Applicant: Siemens Industry Software Inc., Plano, TX (US)

(72) Inventors: Yingdi Liu, Wilsonville, OR (US); Nilanjan Mukherjee, Wilsonville, OR (US); Janusz Rajski, West Linn, OR (US); Grzegorz Mrugalski, Swarzedz (PL); Jerzy Tyszer, Poznan (PL); Bartosz Wlodarczak, Swarzędz (PL)

(73) Assignee: Siemens Industry Software Inc., Plano, TX (US)

( * ) Notice: Subject to any disclaimer, the term of this patent is extended or adjusted under 35 U.S.C. 154(b) by 0 days.

(21) Appl. No.: 17/753,332

(22) PCT Filed: Sep. 6, 2019

(86) PCT No.: PCT/US2019/049834
§ 371 (c)(1),
(2) Date: Feb. 28, 2022

(87) PCT Pub. No.: WO2021/045769
PCT Pub. Date: Mar. 11, 2021

(65) Prior Publication Data
US 2022/0308110 A1    Sep. 29, 2022

(51) Int. Cl.
*G01R 31/3177* (2006.01)
*G01R 31/3185* (2006.01)

(52) U.S. Cl.
CPC . *G01R 31/3177* (2013.01); *G01R 31/318533* (2013.01); *G01R 31/318547* (2013.01)

(58) Field of Classification Search
CPC ........ G01R 31/3177; G01R 31/318533; G01R 31/318547
(Continued)

(56) References Cited

U.S. PATENT DOCUMENTS 5,694,402 A    12/1997  Butler et al.
6,557,129 B1 *  4/2003  Rajski ............ G01R 31/318547
                                                          714/732
(Continued)

OTHER PUBLICATIONS

PCT International Search Report and Written Opinion of International Searching Authority dated May 29, 2020 corresponding to PCT International Application No. PCT/US2019/049834 filed Sep. 6, 2019.

(Continued)

*Primary Examiner* — John J Tabone, Jr.

(57) ABSTRACT

A circuit comprises scan gating devices inserted between outputs of scan chains and inputs of a test response compactor. The scan gating devices divides the scan chains into groups of scan chains. Each of the scan gating devices operates in either an enabled mode or a disenabled mode based on a first signal. A scan gating device operating in the enabled mode blocks, blocks only at some clock cycles, or does not block a portion of a test response of a test pattern captured by and outputted from a scan chain in the associated scan chain group based on a second signal. Scan gating devices operating in the disenabled mode do not block, or based on a third signal, either block or do not block, a portion of the test response captured by and outputted from all scan chains in each of the associated scan chain groups.

20 Claims, 16 Drawing Sheets

Test response compacting system 200

(58) Field of Classification Search
USPC .............................. 714/726, 729, 727, 728
See application file for complete search history.

(56) References Cited

U.S. PATENT DOCUMENTS

| | | | | |
|---|---|---|---|---|
| 7,376,873 | B2* | 5/2008 | Vranken | G01R 31/318547 714/724 |
| 7,818,644 | B2 | 10/2010 | Rajski et al. | |
| 7,925,947 | B1* | 4/2011 | Touba | G01R 31/318547 714/732 |
| 8,108,743 | B2* | 1/2012 | Rajski | G01R 31/318547 714/732 |
| 8,468,404 | B1* | 6/2013 | Chickermane | G01R 31/318575 714/742 |
| 9,448,282 | B1* | 9/2016 | Meehl | G01R 31/318335 |
| 9,651,622 | B2 | 5/2017 | Rajski et al. | |
| 10,476,740 | B1* | 11/2019 | Cote | G06F 30/33 |
| 10,746,790 | B1* | 8/2020 | Cook Lobo | G01R 31/31724 |
| 11,320,487 | B1* | 5/2022 | Cheng | G01R 31/318536 |
| 2005/0222816 | A1* | 10/2005 | Cheng | G06F 11/267 702/185 |
| 2007/0067688 | A1* | 3/2007 | Vranken | G01R 31/318547 714/733 |
| 2007/0234157 | A1 | 10/2007 | Rajski et al. | |
| 2007/0234169 | A1* | 10/2007 | Rajski | G01R 31/31727 714/742 |
| 2008/0195346 | A1* | 8/2008 | Lin | G01R 31/318575 702/120 |
| 2009/0119559 | A1* | 5/2009 | Foutz | G01R 31/318547 714/E11.155 |
| 2009/0210762 | A1* | 8/2009 | Wang | G01R 31/318547 714/729 |
| 2009/0254786 | A1* | 10/2009 | Cheng | G01R 31/318371 714/E11.155 |
| 2010/0090706 | A1* | 4/2010 | Malach | G01R 31/318547 324/537 |
| 2010/0299567 | A1* | 11/2010 | Hapke | G06F 11/27 714/E11.155 |
| 2014/0317463 | A1* | 10/2014 | Chandra | G01R 31/318566 714/729 |
| 2014/0372821 | A1* | 12/2014 | Rajski | G01R 31/318575 714/727 |
| 2015/0100841 | A1* | 4/2015 | Gizdarski | G01R 31/318385 714/727 |
| 2015/0149847 | A1* | 5/2015 | Huang | G01R 31/318335 714/738 |
| 2016/0003907 | A1* | 1/2016 | Rasjki | G01R 31/318547 714/738 |
| 2016/0245863 | A1* | 8/2016 | Mrugalski | G01R 31/318547 |
| 2017/0141930 | A1* | 5/2017 | Rajski | G06F 21/75 |
| 2018/0252768 | A1* | 9/2018 | Rajski | G01R 31/31727 |
| 2020/0174069 | A1* | 6/2020 | Narayanan | G01R 31/318536 |
| 2022/0308110 | A1* | 9/2022 | Liu | G01R 31/318547 |

OTHER PUBLICATIONS

J. Rajski, J. Tyszer, G. Mrugalski, W-T. Chen, N. Mukherjee, M. Kassab, "X-Press Compactor for 1000X Reduction of Test Data", in Proceedings of ITC, 2006.

D. Czysz, G. Mrugalski, N. Mukherjee, J. Rajski, and J. Tyszer, "On compaction utilizing inter and intra correlation of unknown states," IEEE Trans. CAD, Jan. 2010, pp. 117-126, vol. 29.

P. Wohl, J.A. Waicukauski, G. A. Maston, and J.E. Coburn, "XLBIST: X-Tolerant Logic BIST", in Proceedings of ITC, 2018.

C. Barnhart, V. Brunkhorst, F. Distler, O. Farnsworth, B. Keller, B. Koenemann, and A. Ferko, "OPMISR: the foundation for compressed ATPG vectors," in Proc. ITC, 2001, pp. 748-757.

* cited by examiner

UNIVERSAL COMPACTOR ARCHITECTURE FOR TESTING CIRCUITS

FIELD OF THE DISCLOSED TECHNIQUES

The presently disclosed techniques relates to circuit testing. Various implementations of the disclosed techniques may be particularly useful for suppressing X-states in circuit test responses.

BACKGROUND OF THE DISCLOSED TECHNIQUES

Test data compression is widely recognized as instrumental in reducing the overall cost of scan-based semiconductor device testing. With aggressive technology scaling, test response compaction, working synergistically with test stimuli compression, plays a key role in handling test data volume growth. Development of compaction schemes reflects ever-changing needs of many applications and addresses insatiable consumer demands for greater performance at a lower cost. Logic built-in self-test (LBIST) integrated with on-chip test compression has reappeared recently as a viable in-system test alternative. In many instances, this hybrid technique is considered a safety mechanism that can be periodically applied during a device's run-time to detect faults in automotive integrated circuits and other safety-critical applications. It offers high test coverage attainable in a very short period of time, including in-field test procedures. As architectural differences between test compression and LBIST are gradually blurring, design for test (DFT) implementations can efficiently share test logic between the two approaches, including test response compactors. Consequently, an important requirement for a reliable compactor is to preserve observability of scan cells, while (1) maintaining very high compaction ratios, (2) providing ability to detect a variety of failures found in real silicon, and (3) assuring design simplicity.

Test response compaction is vulnerable to unknown (X) states, which can render test useless. X values occur in complex designs due to uninitialized memory elements, non-scan flip-flops, bus contentions, floating buses, unwrapped analog modules, internal three-state logic, cross clock domain signals, timing exceptions, or multi-cycle and false paths when generating at-speed tests. These states, once captured in scan cells, may subsequently be injected into a test response compactor, where they can severely affect test results. In particular, X states can quickly proliferate due to a feedback deployed by time compactors, such as multiple-input signature registers (MISR). While modular time compactors prevent multiplication of unknown states by means of circular registers, they may only reduce the negative impact of X states partially. Combinational compactors remain relatively immune to X states, but to avoid masking they need to observe every scan chain on two or more outputs. Finite memory compactors flush X states out of their registers in a number of scan shift cycles. However, even if a test compactor is designed to tolerate a certain amount of X states, they may quickly take over, prevent observability of many scan cells, and cause a fault coverage drop. The compactor requires, therefore, a protection mechanism capable of effectively masking X states by, for example, deploying a scan chain selection scheme.

The ability to selectively observe scan chains had been extensively researched for years. The proposed schemes offer a variety of trade-offs between on-chip logic complexity, a collateral damage (denoting inadvertent masking of non-X values), and test data needed to control X-masking. For example, one scheme called OPMISR features a circuit for masking selected unload values so that X states do not reach a compactor. In another scheme, a selective compactor is used as a part of the embedded deterministic test (EDT) technology. It masks a given number of scan chains by deploying a register file to encode targeted scan chains. In still another scheme, LFSR (linear-feedback shift register) reseeding is used to gate scan chains per cycle. Masking signals obtained in this fashion can be further formed by AND-ing phase shifter outputs to reduce the probability of blocking non-X responses. In still another scheme, each input is connected to two outputs and every two outputs share a single input in a two-stage selector of X-tolerant deterministic BIST. It allows observation of a small fraction of scan chains. In still another scheme, an X-masking logic allows certain amount of over-masking while it is obtained as an instance of logic synthesis with don't cares, where inputs are provided by any LBIST or test compression scheme. In still another scheme, channel masking either disables all scan chains or selects those belonging to one of two groups at the price of possible over-masking. In still another scheme, two-level scan selection mechanism and a sequential overdrive section are employed. These modules are tied together using a scan chain ranking algorithm for handling a wide range of X state profiles and guiding suppression of X states. In still another scheme, BIST-like selective masking of scan chains is performed to block X states per cycle. This relies on a finding that many test responses in scan-based designs feature identical or similar patterns of X states occurring in contiguous and adjacent areas of scan chains.

A different class of solutions attempts to make test response compactors X-tolerant. For example, a weighted pseudorandom pattern generator (PRPG) can be used to implement an X-tolerant multiple input signature register. No data transfers between memory elements and high X-masking probability are basis of X-tolerance in this solution. In another scheme, an X-filter removes effects of X states from test responses compacted by error correcting codes while preserving their basic functionality. Similarly, a MISR-based scheme is capable of handling a given amount of X states. It periodically applies X-filtering to cancel out Xs and recover all bits of the original signature, which is subsequently unloaded. One can also design a convolutional compactor tolerating a number of X values in a single time frame by taking advantage of Steiner systems as a particular kind of a systematic combinatorial block design process. Nevertheless, despite the best efforts, X-tolerant compactors may still need to resort to masking of scan chains. Indeed, in many applications, X-tolerance is not enough to prevent a damage to test results, unless an expensive and complex test logic is deployed to cope effectively with large bursts of unknown values. Consequently, scan chain selection remains the main stream technology in the X-masking domain.

An X-masking scheme for converged applications of test compression and logic BIST has to respond to a number of challenges and strict requirements of in-field and in-system test. First of all, it is vital to control scan selection, for a wide range of X state profiles, with a minimal amount of additional information, so that this data will not compromise the effective test compression rates. Furthermore, as X-masking hardware remains a non-negligible footprint of many scan selection schemes, it becomes mandatory to reduce this overhead, especially in designs with hundreds (or even thousands) of scan chains that may require programmable and very flexible selection algorithms. It is thus desirable to develop a new scan chain selection scheme comprising a simple and modular scan selection logic that allows masking X states within re-definable groups of scan chains and designated scan shift cycles.

Brief Summary of the Disclosed Techniques

Various aspects of the disclosed technology relate to scan selection-based X-masking for test response compaction. In one aspect, there is a circuit, comprising: scan chains comprising scan cells, the scan chains configured to shift in test patterns, apply the test patterns to the circuit, capture test responses of the circuit, and shift out the test responses; a test response compactor configured to compact the test responses; and scan gating devices inserted between outputs of the scan chains and inputs of the test response compactor, the scan gating devices dividing the scan chains into groups of scan chains, each of the scan gating devices receiving signals from outputs of one of the groups of scan chains and operating in either an enabled mode or a disenabled mode based on a first signal, wherein a scan gating device operating in the enabled mode blocks, blocks only at one or more clock cycles, or does not block a portion of a test response of a test pattern captured by and outputted from a scan chain in a group of scan chains coupled to the scan gating device operating in the enabled mode from reaching the test response compactor based on a second signal, and wherein scan gating devices operating in the disenabled mode do not block, or based on a third signal, either block or do not block, a portion of the test response of the test pattern captured by and outputted from all scan chains in each of groups of scan chains coupled to the scan gating devices operating in the disenabled mode from reaching the test response compactor.

The circuit may further comprise: address converting and decoding circuitry configured to generate the first signal based on an address signal, or a combination of the address signal and a fourth signal, or a combination of the address signal, a fourth signal and a fifth signal, wherein bits of the fourth signal can overwrite bits of the address signal to increase number of the scan gating devices being enabled, and wherein the fifth signal allows an immediate neighbor of a scan gating device to be enabled. Alternatively, the circuit may further comprise: a configuration register configured to store the first signal and provide the first signal to the each of the scan gating devices.

The circuit may further comprise: a selector configured to generate the second signal based on a selection signal and a block-on signal and a block-off signal, wherein the selection signal defines which clock cycles to block, and wherein a combination of the block-on signal and the block-off signal determines which scan chain output to be blocked, to be not blocked, or to be blocked based on the selection signal.

The circuit may further comprise: a pseudo-random pattern generator configured to generate test patterns; and a decompressor configured to supply signals, based on which at least the first signal and the second signal are generated.

The circuit may further comprise: a comparison device configured to compare an output signal from the test response compactor with a reference signal.

The circuit may further comprise: a decompressor configured to decompress compressed test patterns into the test patterns. The decompressor may comprise a ring generator and a phase shifter.

Each of the scan gating devices may comprise a plurality of subunits, each of the subunits comprising a multiplexer and an AND gate for each of the scan chains in the group of scan chains coupled to the each of the scan gating devices.

The test response compactor may comprise an XOR gate network or an inverter network.

In another aspect, there are one or more non-transitory computer-readable media storing computer-executable instructions for causing one or more processors to perform a method, the method comprising: creating a circuit in a circuit design for testing a chip fabricated according to the circuit design.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the disclosed techniques. Thus, for example, those skilled in the art will recognize that the disclosed techniques may be embodied or carried out in a manner that achieves or optimizes one advantage or group of advantages as taught herein without necessarily achieving other objects or advantages as may be taught or suggested herein.

DETAILED DESCRIPTION OF THE
DISCLOSED TECHNIQUES

General Considerations

Various aspects of the disclosed technology relate to scan selection-based X-masking for test response compaction. In the following description, numerous details are set forth for the purpose of explanation. However, one of ordinary skill in the art will realize that the disclosed technology may be practiced without the use of these specific details. In other instances, well-known features have not been described in details to avoid obscuring the disclosed technology.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods.

The detailed description of a method or a device sometimes uses terms like "block" and "generate" to describe the disclosed method or the device function/structure. Such terms are high-level descriptions. The actual operations or functions/structures that correspond to these terms will vary depending on the particular implementation and are readily discernible by one of ordinary skill in the art.

Additionally, as used herein, the term "design" is intended to encompass data describing an entire integrated circuit device. This term also is intended to encompass a smaller group of data describing one or more components of an entire device such as a portion of an integrated circuit device nevertheless.

Illustrative Operating Environment

Figure 1:
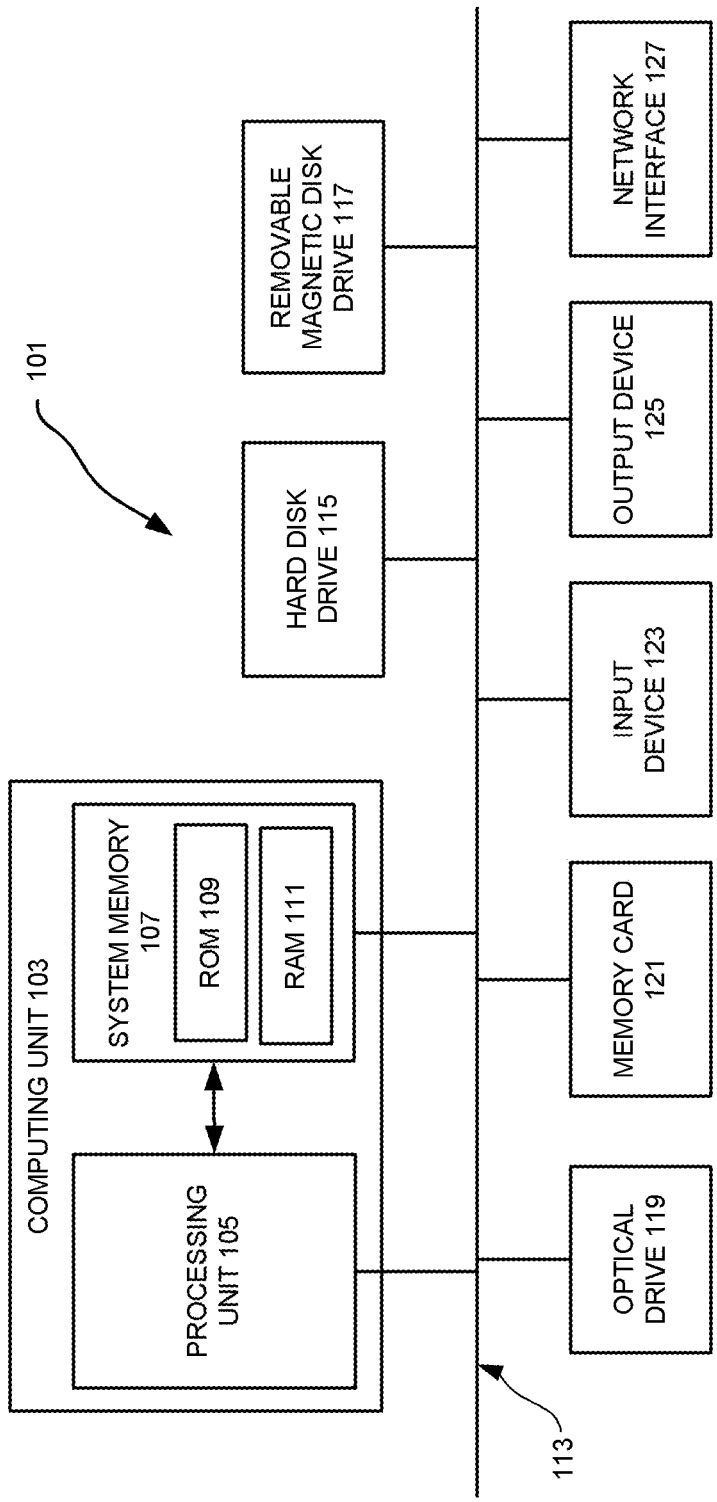
FIG. 1 illustrates a programmable computer system with which various embodiments of the disclosed technology may be employed.

Various examples of the disclosed technology may be implemented through the execution of software instructions by a computing device, such as a programmable computer. Accordingly, FIG. 1 shows an illustrative example of a computing device 101. As seen in this figure, the computing device 101 includes a computing unit 103 with a processing unit 105 and a system memory 107. The processing unit 105 may be any type of programmable electronic device for executing software instructions, but it will conventionally be a microprocessor. The system memory 107 may include both a read-only memory (ROM) 109 and a random access memory (RANI) 111. As will be appreciated by those of ordinary skill in the art, both the read-only memory (ROM) 109 and the random access memory (RANI) 111 may store software instructions for execution by the processing unit 105.

The processing unit 105 and the system memory 107 are connected, either directly or indirectly, through a bus 113 or alternate communication structure, to one or more peripheral devices. For example, the processing unit 105 or the system memory 107 may be directly or indirectly connected to one or more additional memory storage devices, such as a "hard" magnetic disk drive 115, a removable magnetic disk drive 117, an optical disk drive 119, or a flash memory card 121. The processing unit 105 and the system memory 107 also may be directly or indirectly connected to one or more input devices 123 and one or more output devices 125. The input devices 123 may include, for example, a keyboard, a pointing device (such as a mouse, touchpad, stylus, trackball, or joystick), a scanner, a camera, and a microphone. The output devices 125 may include, for example, a monitor display, a printer and speakers. With various examples of the computer 101, one or more of the peripheral devices 115-125 may be internally housed with the computing unit 103. Alternately, one or more of the peripheral devices 115-125 may be external to the housing for the computing unit 103 and connected to the bus 113 through, for example, a Universal Serial Bus (USB) connection.

With some implementations, the computing unit 103 may be directly or indirectly connected to one or more network interfaces 127 for communicating with other devices making up a network. The network interface 127 translates data and control signals from the computing unit 103 into network messages according to one or more communication protocols, such as the transmission control protocol (TCP) and the Internet protocol (IP). Also, the interface 127 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 101 is illustrated as an example only, and it is not intended to be limiting. Various embodiments of the disclosed technology may be implemented using one or more computing devices that include the components of the computer 101 illustrated in FIG. 1, which include only a subset of the components illustrated in FIG. 1, or which include an alternate combination of components, including components that are not shown in FIG. 1. For example, various embodiments of the disclosed technology may be implemented using a multi-processor computer, a plurality of single and/or multiprocessor computers arranged into a network, or some combination of both.

Design For Test, Test Pattern Generation, And Testing

The reduction in feature size increases the probability that a manufacture defect in the integrated circuit will result in a faulty chip. A very small defect can result in a faulty transistor or interconnecting wire. Even a single faulty transistor or wire can cause the entire chip to function improperly. Manufacture defects are unavoidable nonetheless, no matter whether the manufacturing process is at the prototype stage or the high-volume manufacturing stage. It is thus necessary to test chips during the manufacturing process. Diagnosing faulty chips is also needed to ramp up and to maintain the manufacturing yield.

Testing typically includes applying a set of test stimuli (test patterns) to the circuit-under-test and then analyzing responses generated by the circuit-under-test. Functional testing attempts to validate that the circuit-under-test operates according to its functional specification while structural testing tries to ascertain that the circuit-under-test has been assembled correctly from some low-level building blocks as specified in a structural netlist and that these low-level building blocks and their wiring connections have been manufactured without defect. For structural testing, it is assumed that if functional verification has shown the correctness of the netlist and structural testing has confirmed the correct assembly of the structural circuit elements, then the circuit should function correctly. Structural testing has been widely adopted at least in part because it enables the test (test pattern) generation to focus on testing a limited number of relatively simple circuit elements rather than having to deal with an exponentially exploding multiplicity of functional states and state transitions.

To make it easier to develop and apply test patterns, certain testability features are added to circuit designs, which is referred to as design for test or design for testability (DFT). Scan testing is the most common DFT method. In a basic scan testing scheme, all or most of internal sequential state elements (latches, flip-flops, et al.) in a circuit design are made controllable and observable via a serial interface. These functional state elements are usually replaced with dual-purpose state elements called scan cells. Scan cells are connected together to form scan chains—serial shift registers for shifting in test patterns and shifting out test responses. A scan cell can operate as originally intended for functional purposes (functional/mission mode) and as a unit in a scan chain for scan (scan mode). A widely used type of scan cell includes an edge-trigged flip-flop with two-way multiplexer for the data input. The two-way multiplexer is typically controlled by a single control signal called scan enable, which selects the input signal for a scan cell from either a scan signal input port or a system signal input port. The scan signal input port is typically connected to an output of another scan cell while the system signal input port is connected to the functional logic. Scan cells can serve as both a control point and an observation point. Control points can be used to set certain logic values at some locations of the circuit-under-test, exciting (activating) a fault and propagating the incorrect value to an observation point. Scan testing allows the test equipment to access gates deeply embedded through the primary inputs/outputs and/or some physical test points and can remove the need for complicated state transition sequences when trying to control or observe what is happening at some internal circuit element.

Test patterns for scan testing are typically generated through an automatic test pattern generation (ATPG) process. ATPG usually focuses on a set of faults derived from a gate-level fault model. A defect is a flaw or physical imperfection caused in a device during the manufacturing process. A fault model (or briefly a fault) is a description of how a defect alters design behavior. For a given target fault, ATPG comprises two phases: fault activation and fault propagation. Fault activation establishes a signal value at the fault site opposite that produced by the fault. Fault propagation propagates the fault effect forward by sensitizing a path from a fault site to a scan cell or a primary output. A fault at a site is said to be detected by a test pattern if a test response value captured by a scan cell or a primary output is different than the expected value. The objective of ATPG is to find a test pattern that, when applied to the circuit, enables testers to distinguish between the correct circuit behavior and the faulty circuit behavior caused by one or more particular faults. Effectiveness of ATPG is measured by the fault coverage achieved for the fault model and the number of generated vectors (test pattern counts), which should be directly proportional to test application time. Here, the fault coverage is defined as a ratio of the number of detected faults vs. the total number of faults.

The most popular fault model used in practice is the single stuck-at fault model. In this model, one of the signal lines in a circuit is assumed to be stuck at a fixed logic value, regardless of what inputs are supplied to the circuit. The stuck-at fault model is a logical fault model because no delay information is associated with the fault definition. Delay faults cause errors in the functioning of a circuit based on its timing. They are caused by the finite rise and fall time periods of the signals in the gates, as well as, the propagation delay of interconnects between the gates. Transition faults are used for their simplicity in modeling spot defects that affect delays at inputs or outputs of gates. Under scan-based tests, the transition faults are associated with an extra delay that is large enough to cause the delay of any path through the fault site to exceed the clock period. Cell internal fault models can be derived using transistor-level circuit simulations (analog simulations). This approach can pinpoint the defect location within a cell for various cell internal defects.

During the circuit design and manufacturing process, a manufacturing test screens out chips (dies) containing defects. The test itself, however, does not identify the reason for the unacceptable low or fluctuating yield that may be observed. Physical failure analysis (PFA) can inspect the faulty chip to locate the defect location(s) and to discover the root cause. The process usually includes etching away certain layers and then imaging the silicon surface by scanning electronic microscopy or focused ion beam systems. This PFA process is laborious and time consuming. To facilitate the PFA process, diagnosis (also referred to as scan diagnosis) is often employed to narrow down possible locations of the defect(s) based on analyzing the fail log (fail file, failure file). The fail log typically contains information about when (e.g., tester cycle), where (e.g., at what tester channel), and how (e.g., at what logic value) the test failed and which test patterns generate expected test responses. The layout information of the circuit design may also be employed to further reduce the number of defect suspects.

Test application in chip manufacturing test is normally performed by automatic test equipment (ATE) (a type of testers). Scan-based tests consume significant amounts of storage and test time on ATE. The data volume increases with the number of logic gates on the chip and the same holds for the number of scan cells. Yet, practical considerations and ATE specifications often limit both the number of pins available for scan in/out and the maximum scan frequency. It is highly desirable to reduce the amount of test data that need to be loaded onto ATE and ultimately to the circuit under test. Fortunately, test patterns are compressible mainly because only 1% to 5% of test pattern bits are typically specified bits (care bits) while the rest are unspecified bits (don't-care bits). Unspecified bits can take on any values with no impact on the fault coverage. Test compression may also take advantage of the fact that test cubes tend to be highly correlated. A test cube is a deterministic test pattern in which the don't-care bits are not filled by ATPG. The correlation exists because faults are structurally related in the circuit.

Various test compression techniques have been developed. In general, additional on-chip hardware before and after scan chains is inserted. The hardware (decompressor) added before scan chains is configured to decompress test stimulus coming from ATE, while the hardware (compactor) added after scan chains is configured to compact test responses captured by the scan chains. The decompressor expands the data from n tester channels to fill greater than n scan chains. The increase in the number of scan chains shortens each scan chain and thus reduces the number of clock cycles needed to shift in each test pattern. Thus, test compression can not only reduce the amount of data stored on the tester but also reduce the test time for a given test data bandwidth.

The embedded deterministic test (EDT) is one example of test compression techniques. The EDT-based compression is composed of two complementary parts: hardware that is embedded on chip, and deterministic ATPG software that generates compressed patterns that utilize the embedded hardware. The EDT hardware features a continuous-flow decompressor. The EDT compression of test cubes is performed by treating the external test data as Boolean variables. Scan cells are conceptually filled with symbolic expressions that are linear functions of input variables injected into the decompressor. In the case of a decompressor comprising a ring generator and an associated phase shifter, a set of linear equations corresponding to scan cells whose values are specified may be used. A compressed pattern can be determined by solving the system of equations. If the compressed pattern determined as such is then scanned in through the decompressor, the bits that were specified by ATPG will be generated accordingly. Unspecified bits are set to pseudorandom values based on the decompressor architecture. Additional details concerning EDT-based compression and decompression are found in J. Rajski, J. Tyszer, M. Kassab, and N. Mukherjee, "Embedded deterministic test," IEEE Trans. CAD, vol. 23, pp. 776-792, May 2004, and U.S. Pat. Nos. 6,327,687; 6,353,842; 6,539, 409; 6,543,020; 6,557,129; 6,684,358; 6,708,192; 6,829, 740; 6,874,109; 7,093,175; 7,111,209; 7,260,591; 7,263, 641; 7,478,296; 7,493,540; 7,500,163; 7,506,232; 7,509, 546; 7,523,372; 7,653,851, of which all are hereby incorporated herein by reference.

Logic built-in self-test (logic BIST) is a DFT technique that permits a circuit to test itself using embedded test logic without the need of an external tester. Classical logic BIST applications include detecting infant mortality defects during burn-in test, enabling the use of low-cost and/or low-speed testers that only provide power and clock signals, and in-system self-testing to improve the reliability of the system in aerospace/defense, automotive, telecommunications and healthcare industries. A typical logic BIST system includes a test pattern generator for automatically generating test patterns, a test response analyzer (compactor) for compacting test responses into a signature and a logic BIST controller for coordinating the BIST operation and for providing a pass/fail indication. A pseudo-random pattern generator (PRPG), a commonly used test pattern generator, can be constructed from a linear feedback shift register (LFSR) or a cellular automaton. To increase the fault coverage, a weighted LFSR may be employed. Another approach is to combine random test patterns with deterministic patterns in some fashion as the BIST logic can be used to handle compressed test patterns that are generated deterministically and stored on chip.

All of the above mentioned processes, design insertion for testing, test pattern generation, and logic diagnosis, are normally performed by various electronic design automation tools such as those in the Tessent family of software tools available from Mentor Graphics Corporation, Wilsonville, Oreg.

X-Masking Through Low-Cost, Fine-Grained Scan Selection

Figure 2:
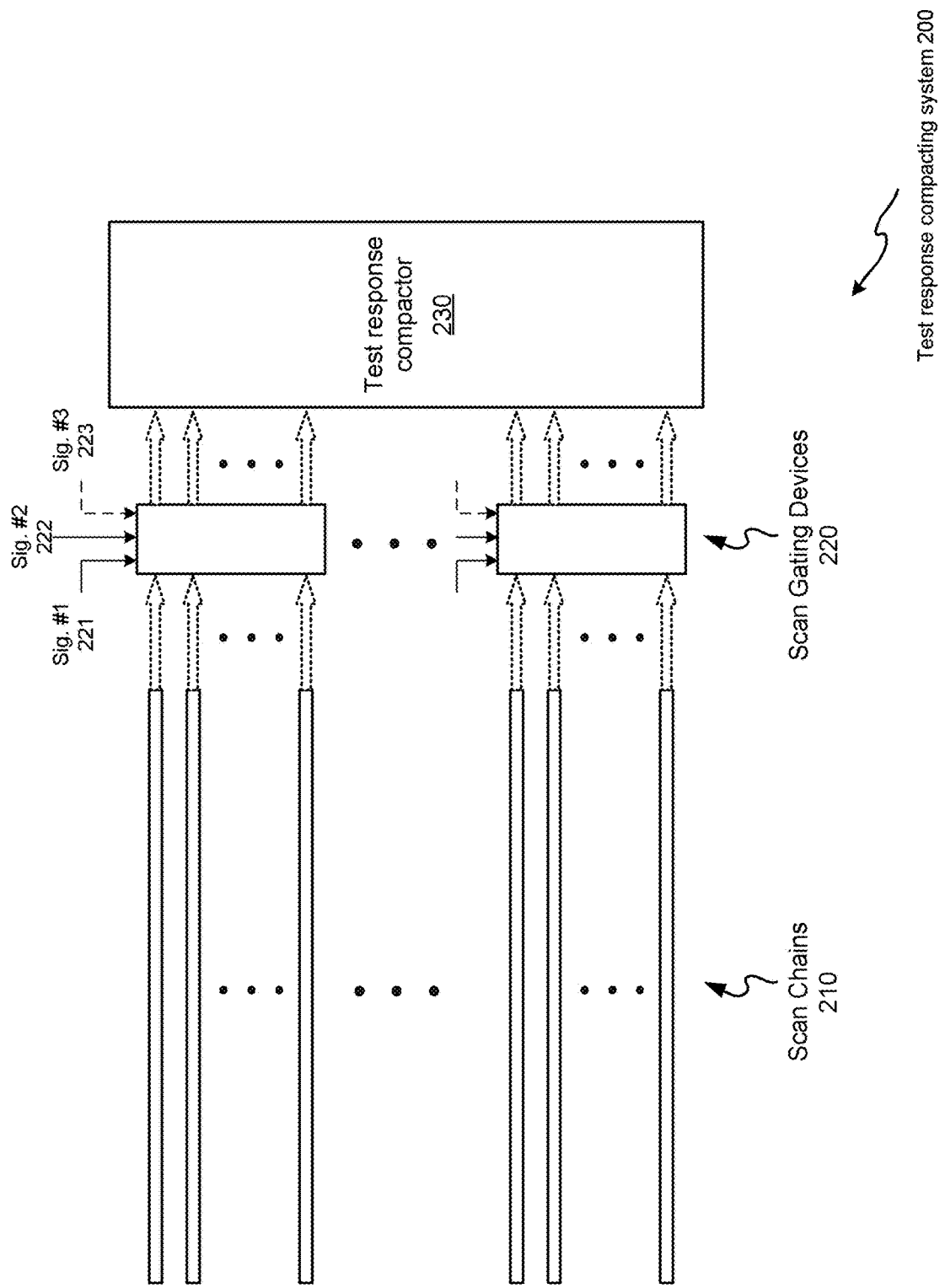
FIG. 2 illustrates an example of a test response compacting system according to various embodiments of the disclosed technology.

FIG. 2 illustrates an example of a test response compacting system 200 according to various embodiments of the disclosed technology. The system 200 comprises scan chains 210, a test response compactor 230, and scan gating devices 220. The scan chains 210, comprising scan cells, are configured in a test mode to shift in test patterns, apply the test patterns to the circuit, capture test responses of the circuit, and shift out the test responses. The test response compactor 230 is configured to compact the test responses. The test response compactor 230 can be a time compactor such as a multiple-input signature register (MISR), a combinational compactor such as an XOR gate network, or a combination of the two. The scan gating devices 220, also referred to as scan gaters, are inserted between outputs of the scan chains 210 and inputs of the test response compactor 230. The scan gating devices 220 divide the scan chains 210 into groups of scan chains. These groups of scan chains can be of equal or nearly equal size. Each of the scan gating devices 220 receives signals from outputs of one of the groups of scan chains and operates in either an enabled mode or a disenabled mode based on a first signal 221. With some implementations of the disclosed technology, only one of the scan gating devices 220 operates in the enabled mode. With some other implementations of the disclosed technology, more than one of the scan gating devices 220 can operate in the enabled mode. A scan gating device operating in the enabled mode blocks, blocks only at one or more clock cycles, or does not block a portion of a test response of a test pattern captured by and outputted from a scan chain in a group of scan chains coupled to the scan gating device operating in the enabled mode from reaching the compactor based on a second signal (222 in FIG. 2). The scan gating devices operating in the disenabled mode can be configured to not block a portion of the test response of the test pattern captured by and outputted from all scan chains in each of groups of scan chains coupled to the scan gating devices operating in the disenabled mode from reaching the test response compactor. A third signal 223 may be used in combination with the first signal 221 to allow disenabled scan gating devices to block or not block test responses, as will be described in detail below.

Figure 3:
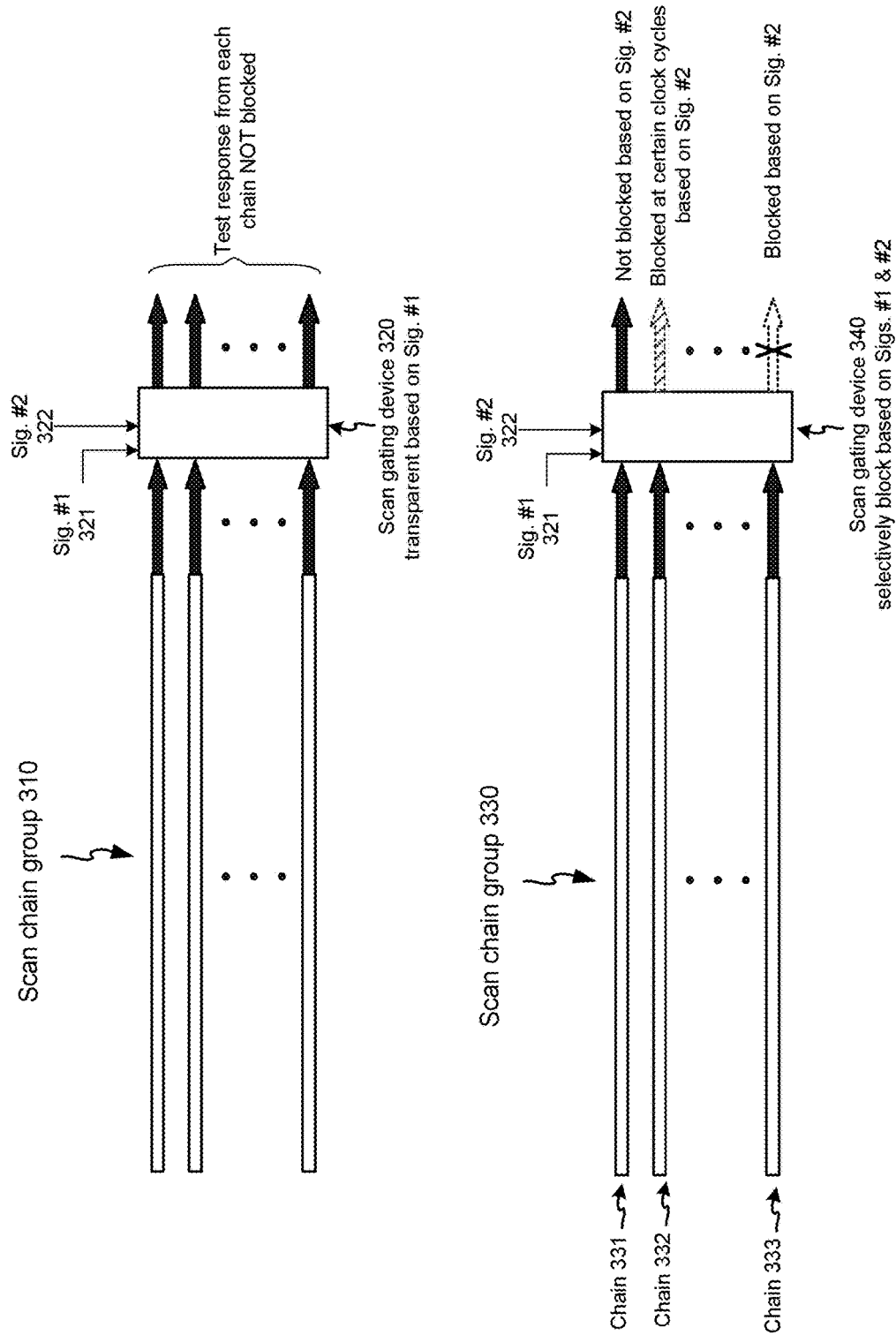
FIG. 3 illustrates an example of a scan gating device being enabled by a first signal.

FIG. 3 shows a scan gating device 340 being enabled by a first signal 321. Based on a second signal 322, the scan gating device 340 let test responses captured by a scan chain 331 pass through, blocks test responses captured by a scan chain 333, blocks only at some clock cycles test responses captured by a scan chain 332. As such, scan chains in a group of scan chains 330 coupled to the enabled scan gating device 340 can be divided into three categories: blocked, cycle-selectively blocked, and unblocked.

Figure 4A:
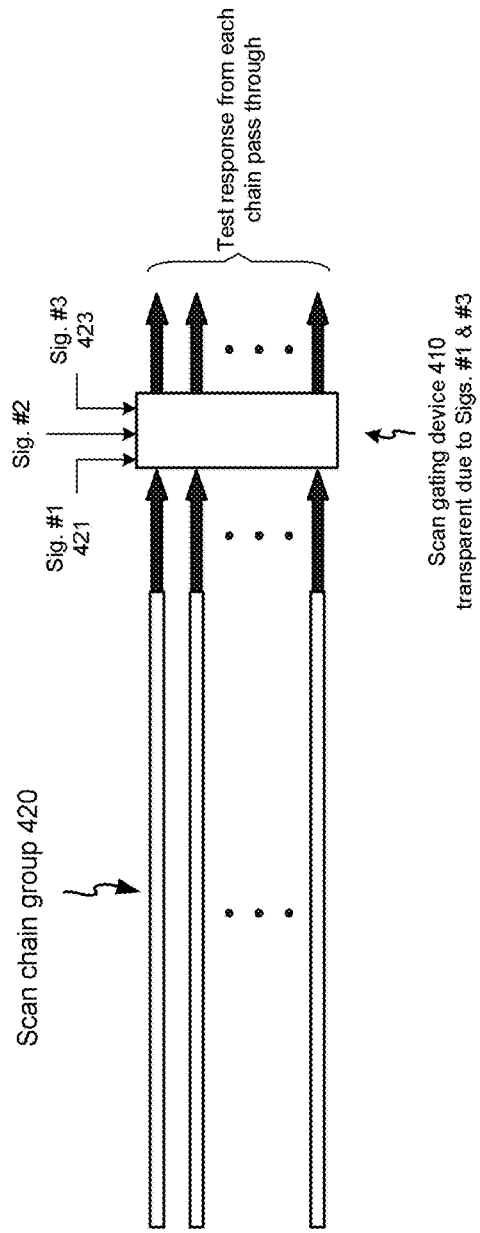
FIG. 4A illustrates an example of a scan gating device disenabled by a first signal allowing test responses captured by scan chains in a scan chain group to pass through based on a third signal.
Figure 4B:
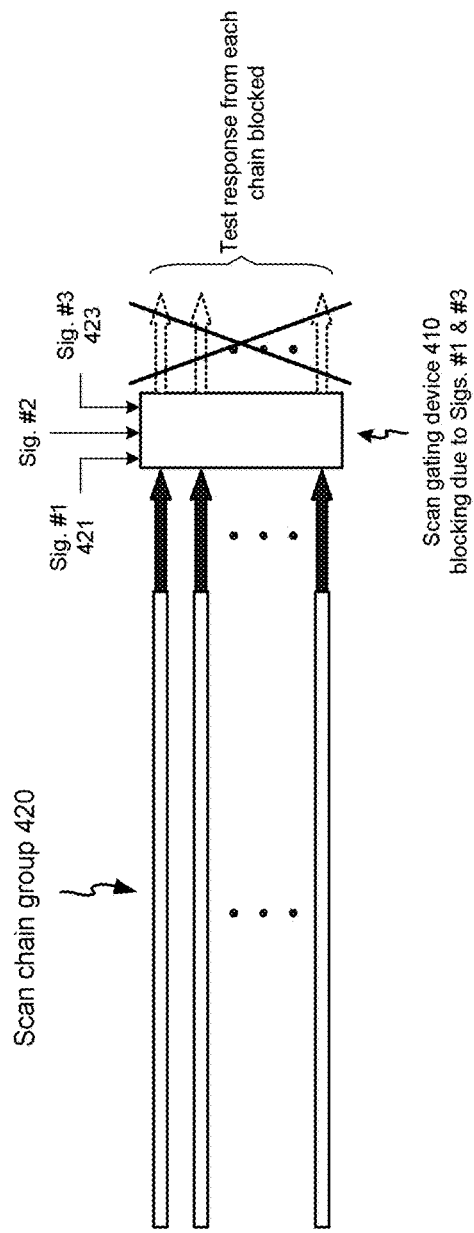
FIG. 4B illustrates an example of a scan gating device disenabled by a first signal blocking test responses captured by scan chains in a scan chain group from passing through based on a third signal.

Also shown in FIG. 3 is a scan gating device 320 disenabled by the first signal 321. Test responses captured by each scan chain in a group of scan chains 310 coupled to the scan gating device 320 are allowed to pass through it. A third signal can be used to allow disenabled scan gating devices either block or unblock test responses captured by the associated groups of scan chains. FIG. 4A illustrates an example of a scan gating device 410 disenabled by a first signal 421 which allows test responses captured by scan chains in a scan chain group 420 to pass through based on a third signal 423. FIG. 4B illustrates an example of the same scan gating device 410 disenabled by the first signal 421 which blocks test responses captured by the scan chains in the scan chain group 420 from passing through based on the third signal 423. This arrangement can cause scan chains of only one group to feed a test response compactor while the remaining scan chains are blocked. This functionality allows very aggressive masking of scan chains, including scenarios with only a single chain being observed.

As the first signal, the second signal, and the third signal (221-223 in FIG. 2, 321-322 in FIG. 3) can vary with test patterns, different scan gating devices can be selected to be enabled/disenabled and different scan chains in the groups of scan chains associated with the enabled scan gating devices can be blocked or partially blocked for different test patterns. This enables masking X states within redefinable groups of scan chains and designated scan shift cycles.

It should be noted that scan chains in the group of scan chains coupled to an enabled scan gating device need not to be always divided into three categories. They can be divided into two categories (e.g., cycle-selectively blocked+ blocked) or even all belong to one category (e.g., cycle-selectively blocked) in some situations based on the second signal.

Figure 5:
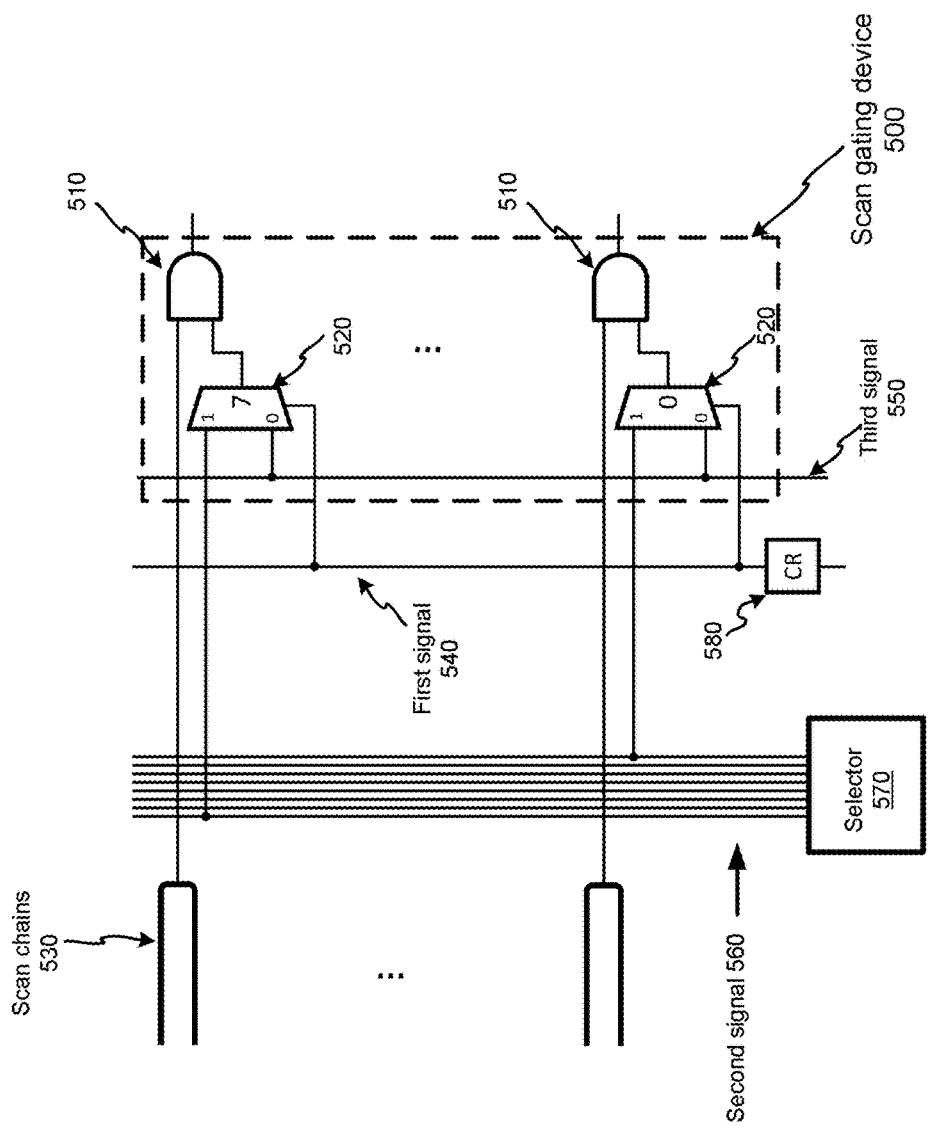
FIG. 5 illustrates an example of a block diagram of a scan gating device with circuitry supplying control signals (the first signal, the second signal and the third signal) according to various embodiments of the disclosed technology.

FIG. 5 illustrates an example of a block diagram of a scan gating device 500 with circuitry supplying control signals (the first signal, the second signal and the third signal) according to various embodiments of the disclosed technology. The scan gating device 500 has a plurality of subunits. The number of the subunits is equal to that of scan chains in a group of scan chains 530 coupled to the scan gating device 500. Each of the subunits includes an AND gate 510 and a multiplexer 520. One input of the AND gate 510 is coupled to the output of a scan chain in the group of scan chains 530. The other input of the AND gate 510 is coupled to the output of the multiplexer 520. A first signal 540 for enabling/disenabling the scan gating device 500, supplied by a flip-flop 580 of a register, is coupled to the select input of the multiplexer 520. The two inputs of the multiplexer 520 are coupled to a second signal 560 and a third signal 550, respectively. The second signal 560 is generated by a selector 570 and has different signal lines for different scan chains in the group of scan chains 530. When the first signal 540 is asserted ("1"), the scan gating device 500 is enabled and the output of each scan chain in the group of scan chains 530 is controlled by one of the signal lines of the second signal 560. The output of a scan chain can be blocked, not blocked, or blocked at selective clock cycles according to a particular signal line. When the first signal 540 is not asserted ("0"), the scan gating device 500 is disenabled and all scan chains in the group of scan chains 530 is controlled by the third signal 550. The outputs of all of the scan chains are either blocked or not blocked depending on whether the third signal 550 is not asserted or asserted.

Figure 6:
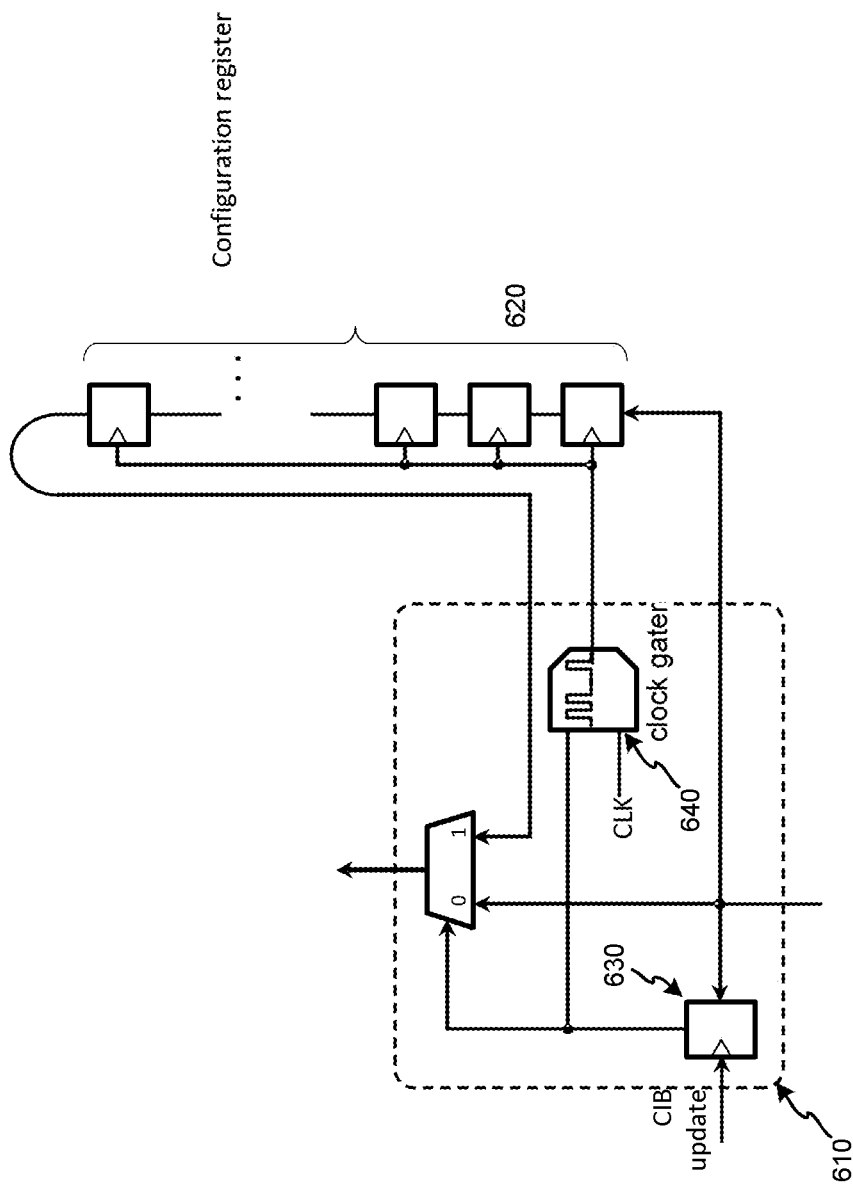
FIG. 6 illustrates an example of a configuration insertion bit circuit for controlling access to a configuration register.

The register (also referred to as configuration register) comprising the flip-flop 540 may be reloaded occasionally because the same content can typically be used for several test patterns in a row. It can be sequestered behind a configuration insertion bit (CIB) 610 as shown in FIG. 6. The configuration insertion bit 610 is deployed to allow on-demand access to the configuration register 620, and to interface the same register with a single ATE input channel. If the flip-flop 630 outputs 0, the CBI 610 is setup to bypass the configuration register 620 and allows only other registers daisy-chained with it to be updated. The configuration register 620 is unaffected in this mode by any data transfer due to clock gating 640. Once asserted, the flip-flop 630 routes additional test data to the configuration register, enabling at the same time a clock signal to facilitate a shift register functionality of the configuration register. The shift path is then established from the ATE input channel, through some registers if any, into the configuration register, and then back through some other registers if any to the decompressor. All changes in the status of the flip-flop 630 are done through the CIB enable input that allows one to capture the first control bit of the input sequence. This bit indicates whether the following sequence is to be used to update the X-masking logic configuration, or it is just a new content of another register.

Figure 7:
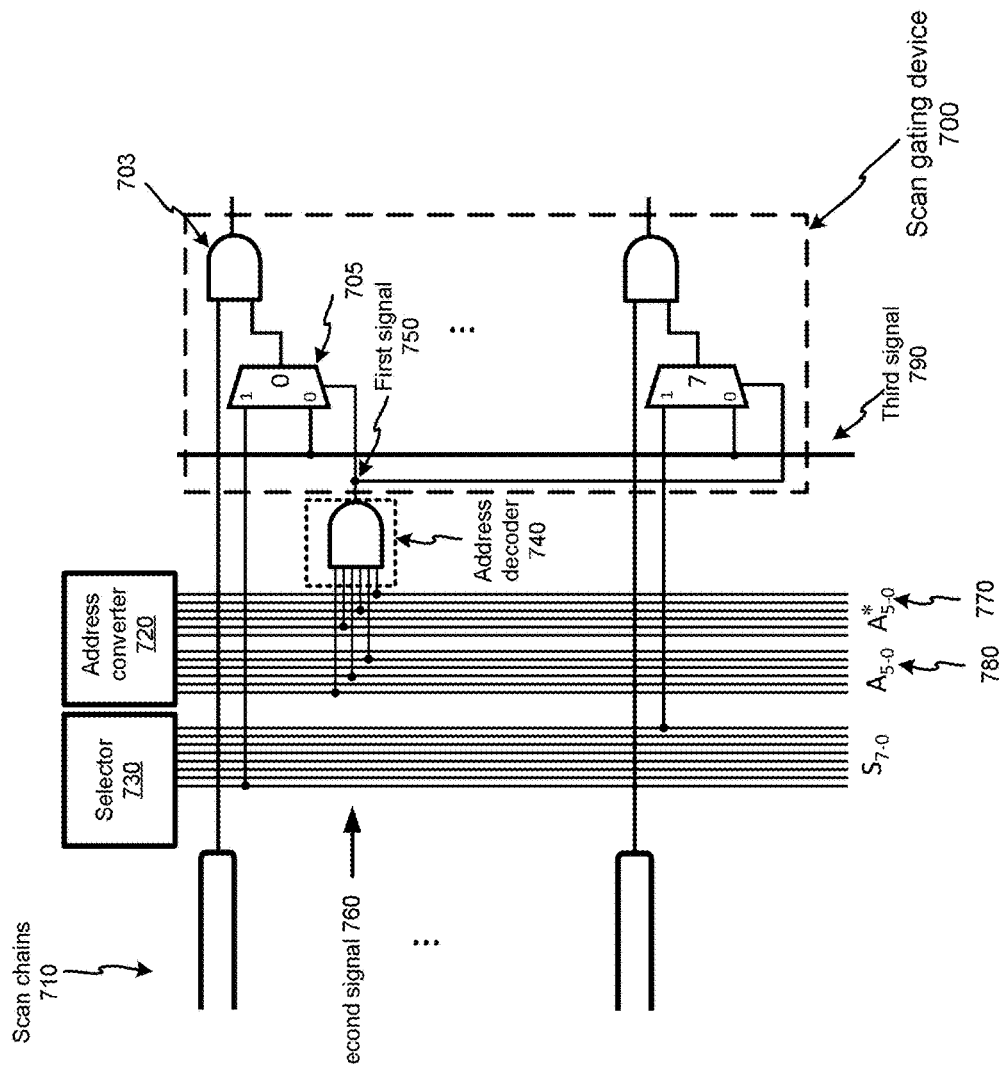
FIG. 7 illustrates another example of a block diagram of a scan gating device with circuitry supplying control signals (the first signal, the second signal and the third signal) according to various embodiments of the disclosed technology.

FIG. 7 illustrates another example of a block diagram of a scan gating device 700 with circuitry supplying control signals (the first signal, the second signal and the third signal) according to various embodiments of the disclosed technology. Similar to the scan gating device 500 in FIG. 5, the scan gating device 700 has a plurality of subunits, of which each comprises an AND gate 703 and a multiplexer 705. Also like the scan gating device 500 in FIG. 5, the third signal 790 is coupled to the Select input of the multiplexer 705, the second signal 760, generated by a selector 730, is coupled to one of the two inputs of the multiplexer 705, and the output of a scan chain in the group of scan chains 720 is coupled to one of the inputs of the AND gate 703. The difference between the setups in FIG. 5 and FIG. 7 is that the first signal 750 is not supplied from a flip-flop but from an address decoder 740. Here, the address decoder 740 is essentially an AND gate which takes outputs of an address converter 720 as its inputs and converts them into the first signal 750. The address decoder 740 for the scan gating device 700 typically uses a combination of the outputs of the address converter 720 different from one used by an address decoder for another scan gating device.

Figure 8:
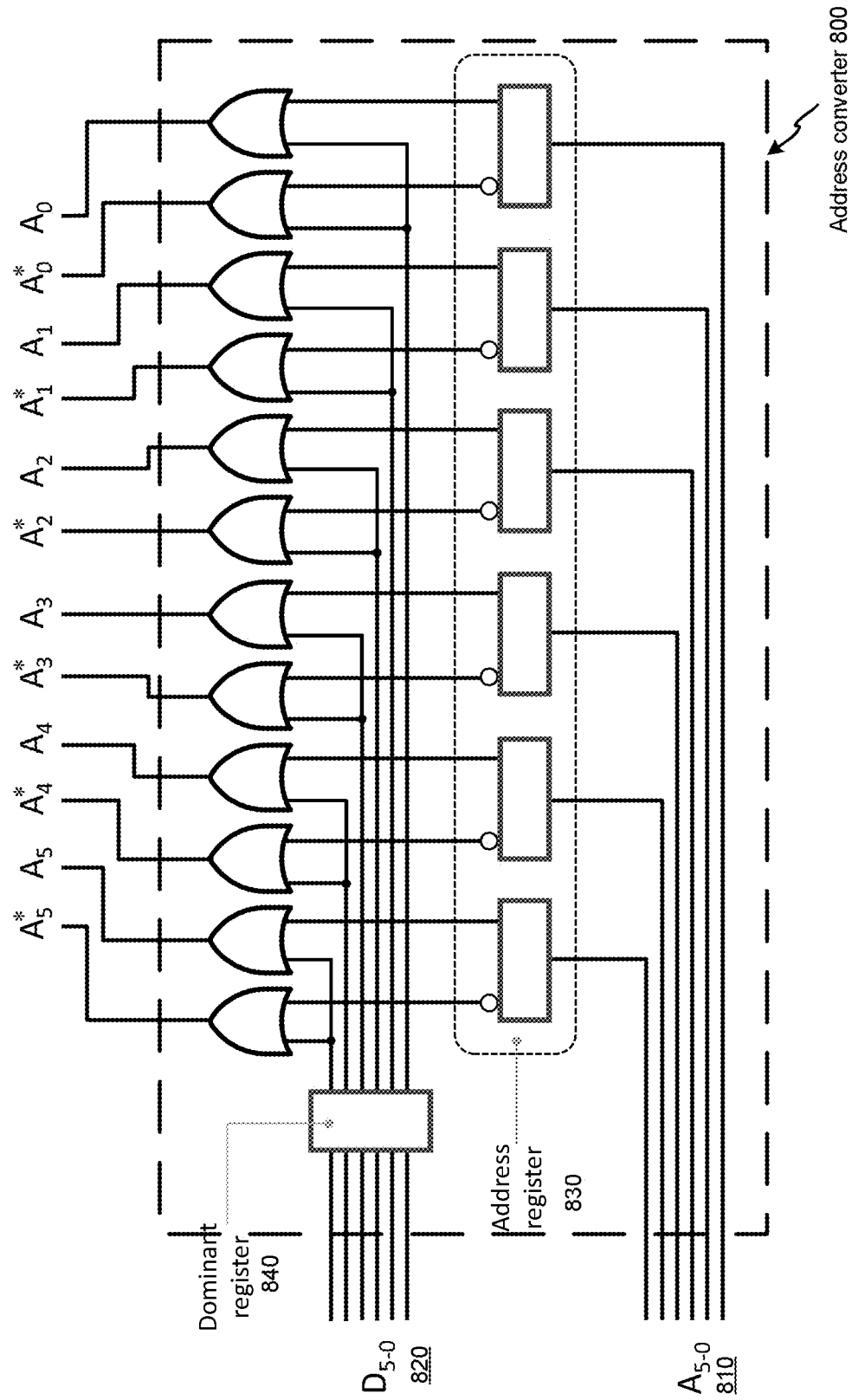
FIG. 8 illustrates an example of an address converter according to various embodiments of the disclosed technology.

If the address bits A* (a group of outputs 770 of the address converter 720) are treated as the inversions of the address bits A (the other group of outputs 780 of the address converter 720), then the address decoders like the address decoder 740 ensure that only one scan gating device is enabled at a time. To enable two or more scan gating devices simultaneously, another signal may be used by an address converter, as illustrated in FIG. 8. The address converter 800 receives regular binary-coded address A (810) and stores it in an address register 830. In addition, the address converter 800 receives the same amount of dominance bits D (820) and stores them at a dominant bit register 840. The dominance bits D (820) indicate which address bits and their inversions should be both replaced with the logic value of 1. In other words, the content of the dominance bit register 840 can overwrite any address bit, if necessary. For instance, if $A_i=1$ and $D_i=0$ at the inputs of the address converter 800, then $A_i=1$ and $A_i^*=0$ at the outputs of the address converter 800. However, the active (1) level of $D_i$ would set both bits A and $A_i^*$ to 1 at the outputs of the address converter 800. As a result, two scan gating devices will be enabled at the same time provided they decode two addresses that only differ on bit i set to 0 and 1, respectively. Using the address converter 800, one can enable various groups of scan gating devices by asserting respective bits of the dominance bit register 840. The number of enabled scan gating devices will be equal to a power of 2. Setting all dominance bits to 1 can enable all scan gating devices. In this scenario, it is now up to the second signal outputted from the selector (e.g., the selector 730) to decide which scan chains are to be masked.

The address converter 800 shown in FIG. 8 facilitates simultaneous selection of several scan gating devices with a granularity determined by the dominance control bits 820. However, certain combinations of scan gating devices and their associated groups of scan chains cannot be enabled simultaneously. For example, the address bits $A_i$=00001 and the dominance bits D=00010 allow a selection of the scan gating devices $G_1$ and $G_3$, but enabling scan gating device $G_2$ in conjunction with $G_1$ and $G_3$ is not possible unless scan gating device $G_0$ is also included by choosing $A_i$=00000 and setting the two least significant dominance bits, i.e., D=00011.

Figure 9:
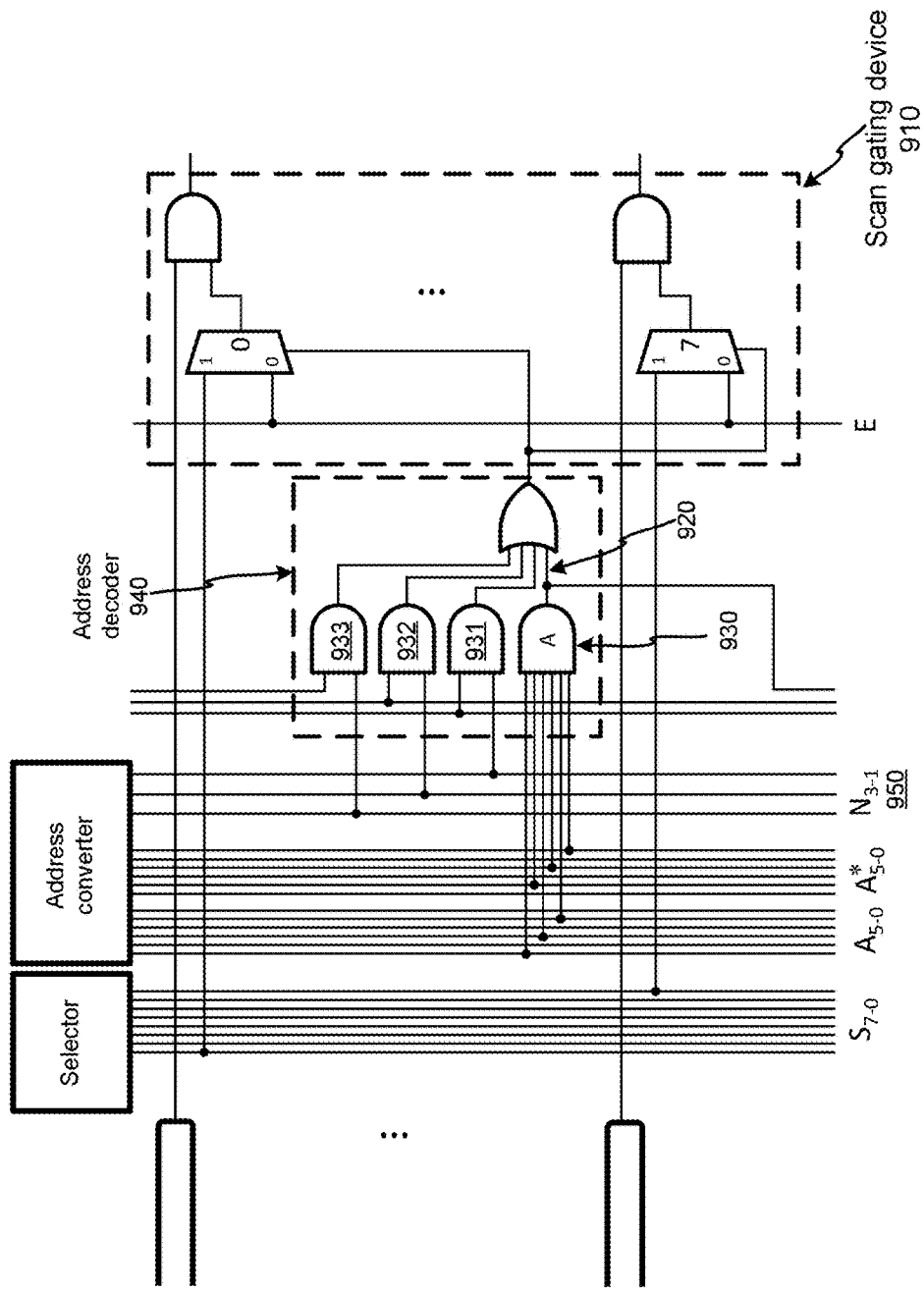
FIG. 9 illustrates an example of an address decoder facilitating simultaneous selection of neighboring scan gating devices.

FIG. 9 illustrates an example of an address decoder $G_A$ (940) which can overcome the above-mentioned drawback, and to make selection of scan gating devices more flexible. In addition to an address AND gate 930 that generates a unique signal 920 based on the address variables and their inversions (as in FIG. 7), the address decoder $G_A$ (940) hosts three 2-input AND gates 931, 932 and 933 driven by additional control lines $N_{3-1}$ (950) and outputs from address AND gates of three address decoders coupled to three preceding scan gating devices $G_{A-1}$, $G_{A-2}$, and $G_{A-3}$ (assuming the scan gating devices are connected in series). As a result, enabling $G_{A-1}$ can select $G_A$ as well, provided the corresponding control line $N_1$ is asserted. Similarly, selecting either $G_{A-2}$ or $G_{A-3}$ can enable $G_A$, if lines $N_2$ or $N_3$ are set to 1, respectively.

Figure 10:
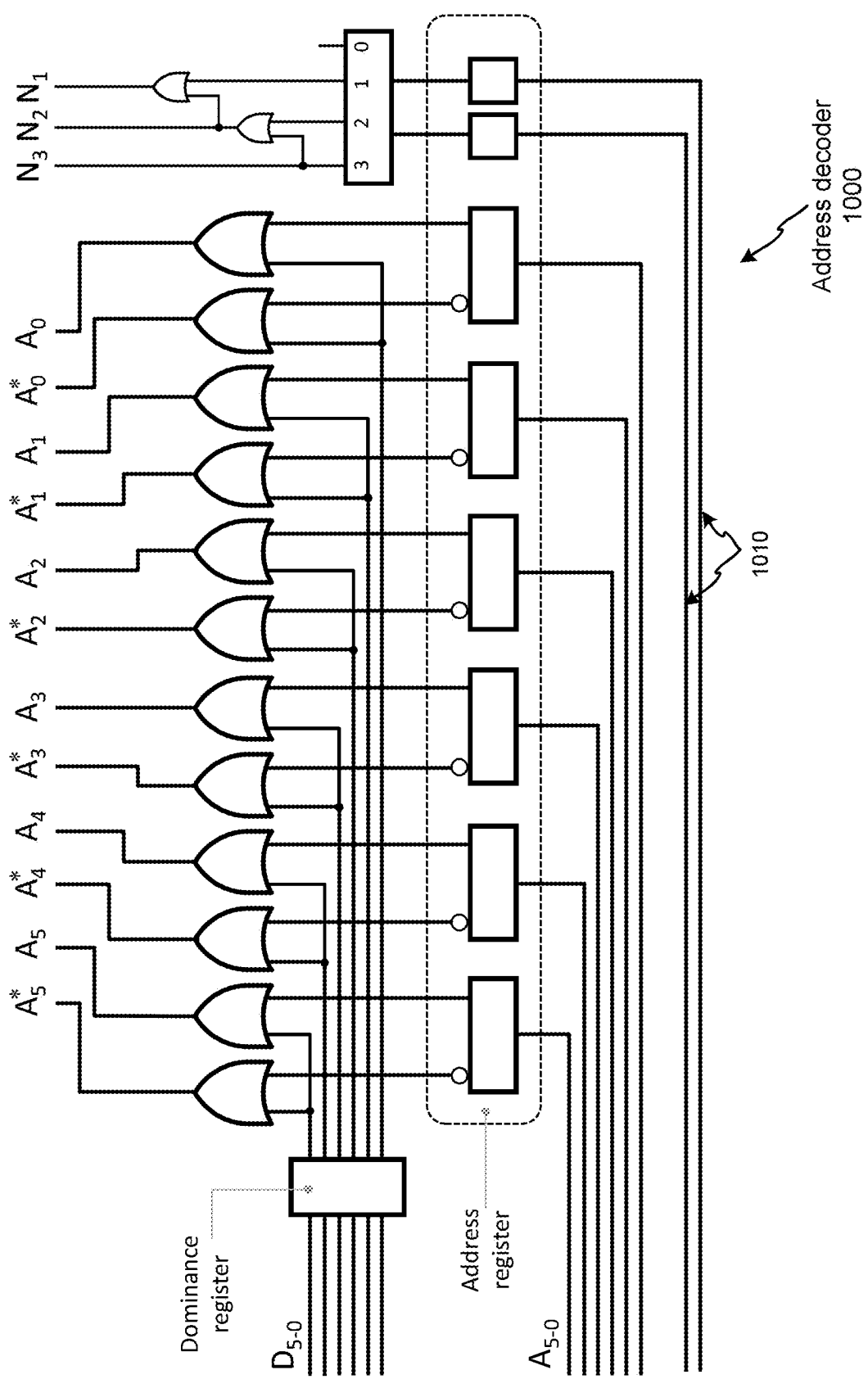
FIG. 10 illustrates an example of an address decoder using two additional control lines to enable a scan gating device $G_k$ along with either $G_{k+1}$, or $G_{k+1}$ and $G_{k+2}$, or $G_{k+1}$, $G_{k+2}$, and $G_{k+3}$.

The address converter 800 shown in FIG. 8 can be redesigned in such a way that lines $N_3N_2N_1$ can only assume one of the following combinations: 000, 001, 011, or 111. FIG. 10 illustrates an example of such an address decoder 1000. Here, two additional control lines 1010 are used to produce signals $N_3$, $N_2$, and $N_1$. Consequently, if lines N permit, a given scan gating device $G_k$ can be enabled in parallel with either $G_{k+1}$, or $G_{k+1}$ and $G_{k+2}$, or $G_{k+1}$, $G_{k+3}$, and $G_{k+3}$.

Figure 11:
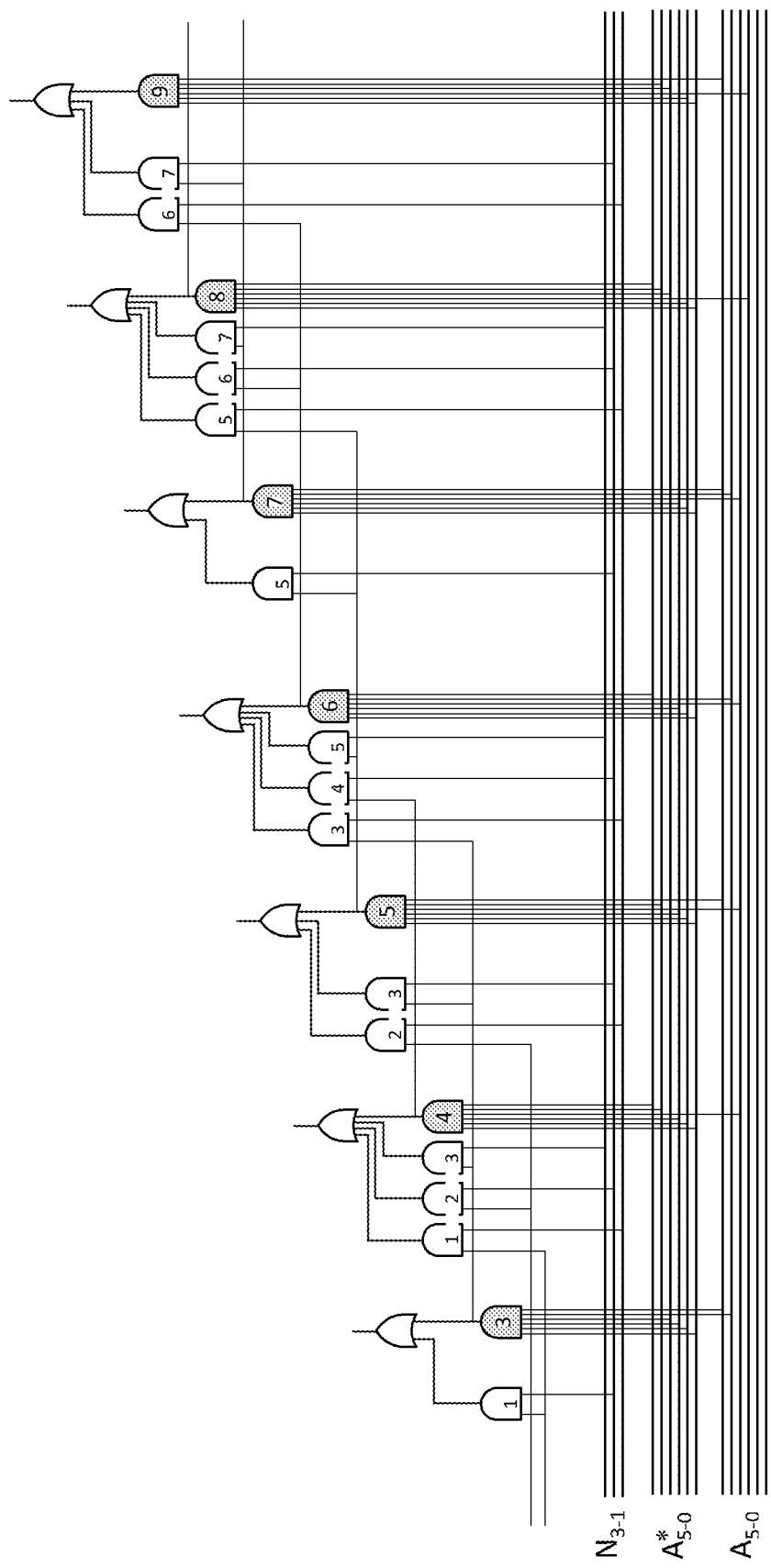
FIG. 11 illustrates an example of detailed architecture of the address decoder comprising logic for the scan gating devices from $G_3$ to $G_9$.

In order to enable $G_0$, $G_1$, and $G_2$, for example, one can select $G_0$, and then set two control lines 1010 used to enable adjacent scan gating devices to a value of 10. It eventually yields control signals $N_3N_2N_1$=011 that enable both $G_1$ and $G_2$. A detailed architecture of the address decoder is illustrated in FIG. 11, comprising address decoding logic for the scan gating devices from $G_3$ to $G_9$ (the remaining parts of the decoder, not shown in the figure, can be designed in a similar manner). As can be seen, the main address decoding AND gates drive the corresponding 2-input AND gates (denoted by the same label) located in the following three scan gating devices. The disclosed technology can easily cover any neighborhood of a given scan gating device in terms of its adjacent modules at a price of additional 2-input AND gates and the control data.

Figure 12:
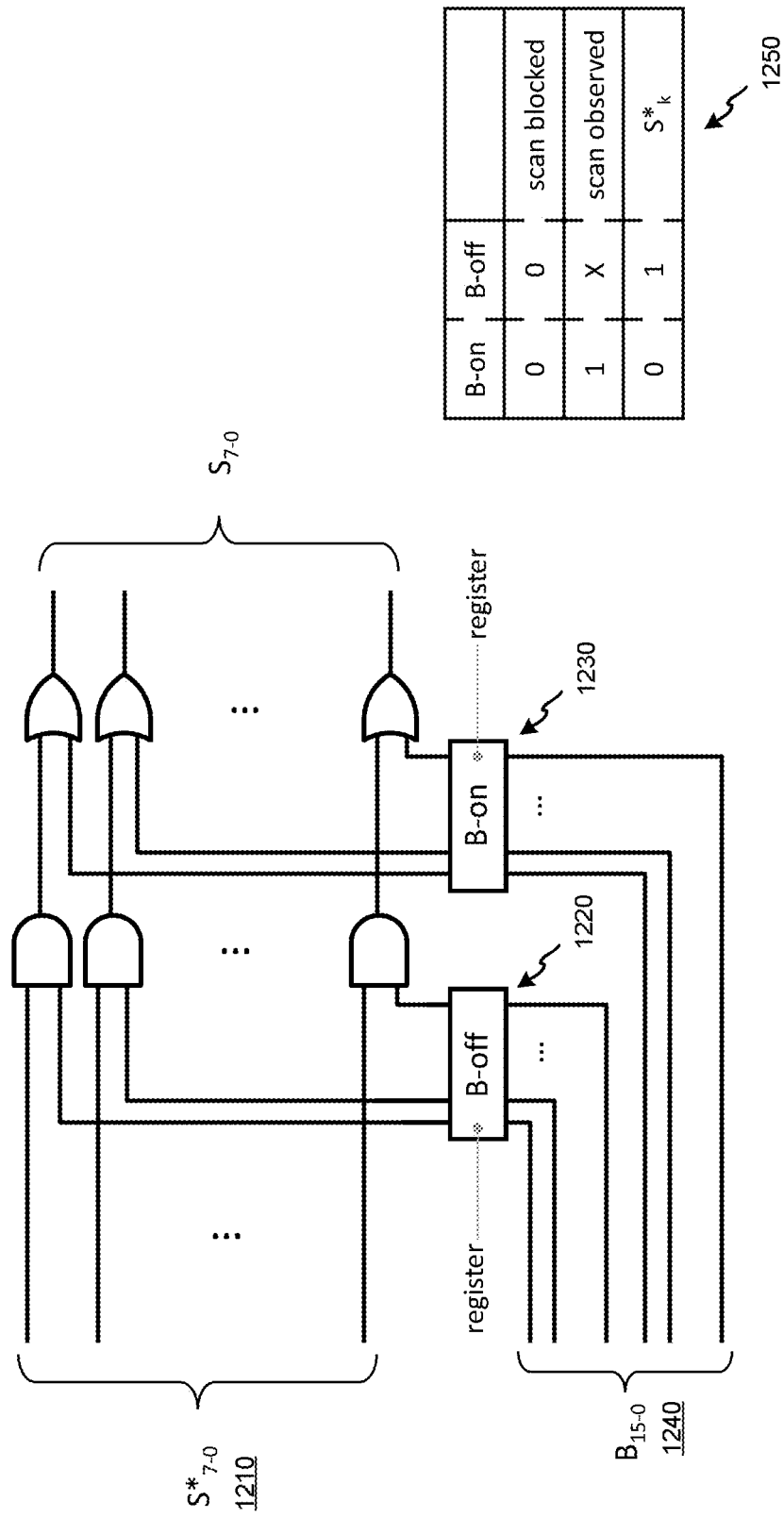
FIG. 12 illustrates an example of a selector configured to generate the second signal according to various embodiments of the disclosed technology.

FIG. 12 illustrates an example of a selector configured to generate the second signal according to various embodiments of the disclosed technology. The second signal determines which scan chains within a group of scan chains coupled to an enabled scan gating device should be masked. The selector architecture illustrated in FIG. 12 assumes that each group consists of eight scan chains. There are two groups of the selector inputs. Inputs denoted as S* (1210) are used to individually gate the corresponding scan chains in a per cycle mode unless the content of configuration registers B-off (1220) and B-on (1230) decides otherwise. These registers are typically reloaded via blockage inputs B (here 16 of them) (1240) once per pattern or groups of patterns. As can be seen, each scan chain is assigned a pair of configuration control bits that determine its masking status as follows. Should bits $b_k$ of both registers 1220 and 1230 are set to 0, then scan chain k is blocked unconditionally for the period of a complete scan unload (the selector output k is set to 0). Asserting bit $b_k$ of register B-on (1230) makes scan chain k fully observable. Finally, setting bit $b_k$ of B-on (1230) to 0 and the corresponding bit of B-off (1220) to 1 allows masking of scan chain k as required by the current status of input $S^*_k$. The above is summarized in a table 1250 in FIG. 12.

Figure 13:
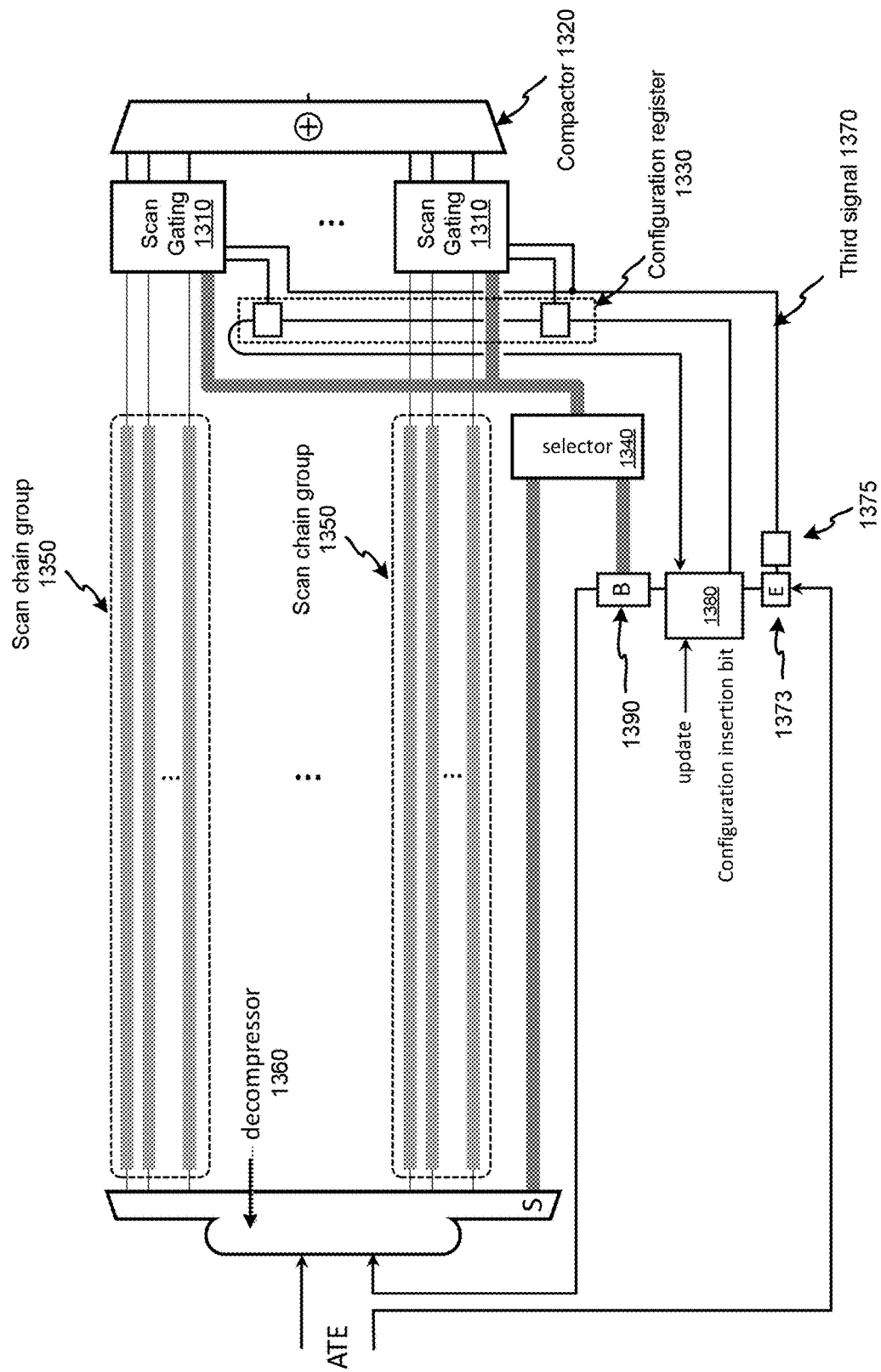
FIG. 13 illustrates an example of test compression logic that employs a configuration register to supply the first signal to scan gating devices according to various embodiments of the disclosed technology.

FIG. 13 illustrates an example of test compression logic that employs a configuration register to supply the first signal to scan gating devices according to various embodiments of the disclosed technology. Scan gating devices 1310 are located between scan chain outputs and a test response compactor 1320 and divide the scan chains into scan chain groups 1350 of almost equal size. Based on control signals (the first, second and third signals), the scan gating devices 1310 selectively block test results leaving chains within each group before they could enter a test response compactor 1320. The first signal is supplied by a configuration register 1330. A configuration insertion bit device 1380 like the one shown in FIG. 6 controls whether to load/update the configuration register 1330. The second signal is supplied by a selector 1340. The selector 1340 like the one shown in FIG. 12 produces the second signal based on B-on and B-off signals provided by a B register 1390 and a select signal from a test data decompressor 1360. The third signal is supplied by two auxiliary buffers 1373 and 1375. One of them 1375 acts as a shadow register allowing one to save this particular control while reloading its new value in parallel with a shift-in of the next test pattern. A similar buffering technique can be adapted for the selection data. The shadow register for the selector 1340 can be a part of the selector as shown in FIG. 12. The primary input registers 1373, 1380 and 1390 are daisy-chained such that they can be updated via a regular ATE channel used to deliver data to the decompressor 1360.

Figure 14:
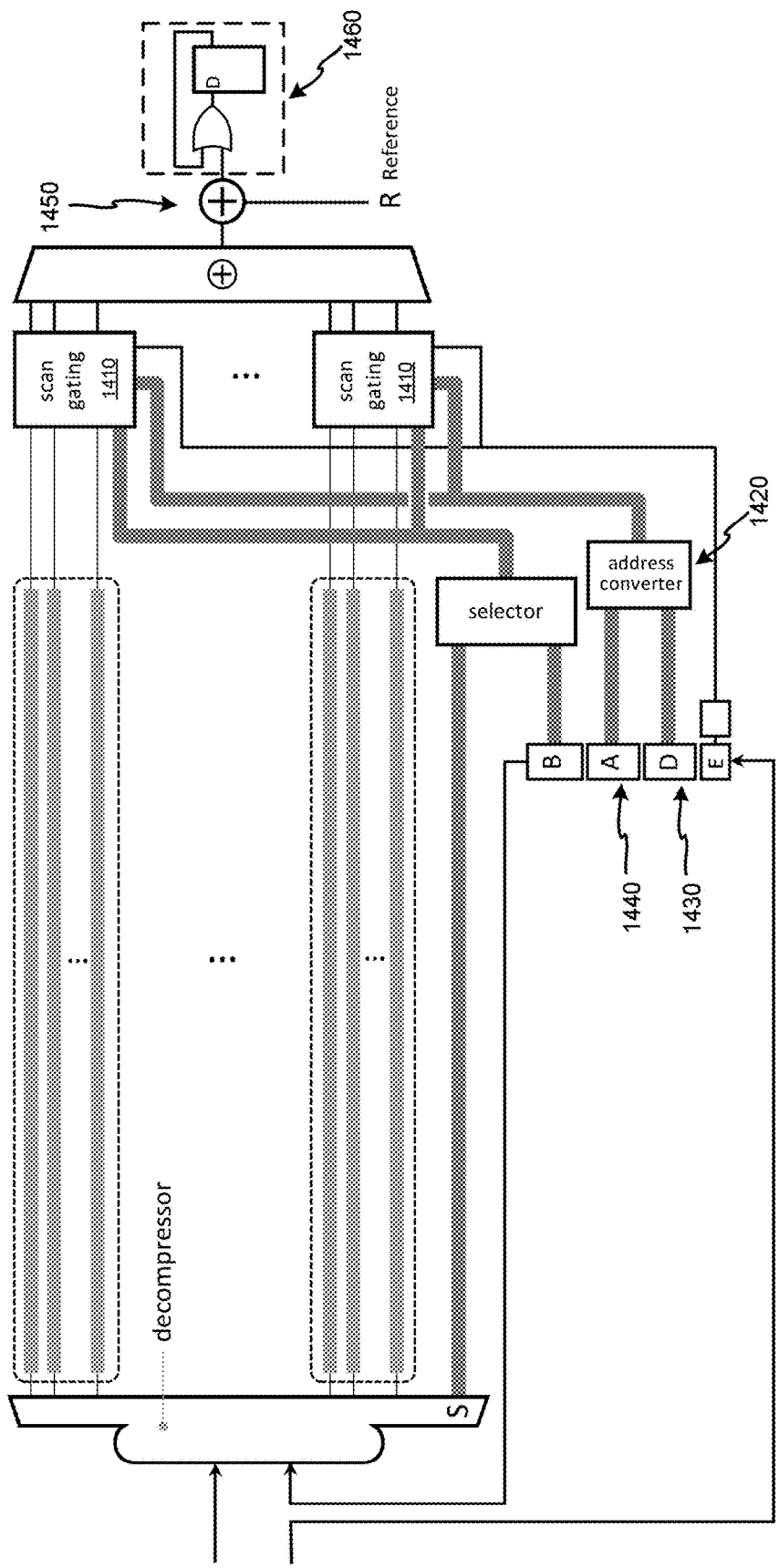
FIG. 14 illustrates an example of test compression logic that employs an address converter to supply the first signal to scan gating devices according to various embodiments of the disclosed technology.

FIG. 14 illustrates an example of test compression logic that employs an address converter to supply the first signal to scan gating devices according to various embodiments of the disclosed technology. The test compression logic shown in FIG. 14 is similar to the one shown in FIG. 13 except for two places. The first one is the test compression logic shown in FIG. 14 employs an address converter 1420 along with a series of address decoders (not shown), rather than a configuration register, to supply the first signal to scan gating devices 1410. The address converter 1420 like the one shown in FIG. 8 produces address output bits based on address bits supplied by an address register 1440 and dominant bits supplied by a dominant bit register 1430. Again, the primary input registers including 1430 and 1440 are daisy-chained such that they can be updated via a regular ATE channel used to deliver data to a decompressor. It should be noted that other types of address converters such as the one shown in FIG. 10 can also be used.

The second difference between FIG. 13 and FIG. 14 is the test compression logic in FIG. 14 has a comparison device 1450 and a sticky-bit device 1460. On-chip comparison of the actual test responses against the expected ones can be readily carried out using the disclosed technology rather than scanning test results out and processing them by means of an external tester. The output ATE channels can thus be replaced with the comparison device 1450 shown in FIG. 14. Here, an additional stream R of a reference data is compared (XOR-ed) against the output stream leaving the test response compactor, and latched as a value of 1 by a stick bit device 1460, if any discrepancy is detected.

Figure 15:
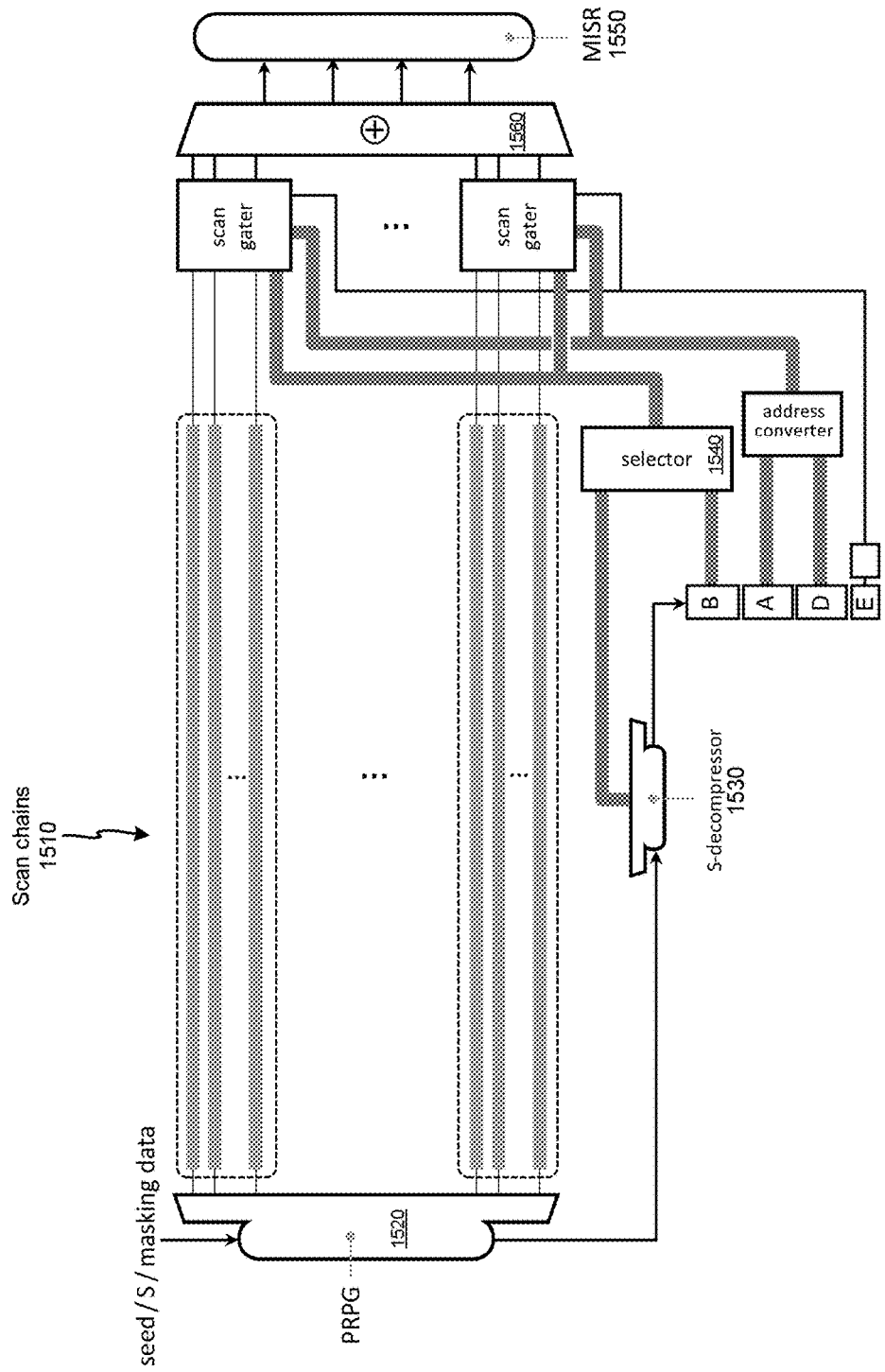
FIG. 15 illustrates an example of a logic BIST scheme implemented with the disclosed technology.

FIG. 15 illustrates an example of a logic BIST scheme implemented with the disclosed technology. Since scan chains 1510 are fed by pseudorandom test patterns generated by a pseudorandom pattern generator (PRPG) 1520, a selector 1540 cannot receive its per-cycle data from a source of test patterns like the one in FIG. 14. Therefore, in addition to data comprising the content of address (A), dominant (D), blockage (B), and E registers, also seeds (S) of a small decompressor 1530 that produces the actual selector inputs in the per-cycle mode are provided through the same input used to seed the PRPG 1520. A compactor here comprises combination logic (e.g., an XOR network) 1560 and a MISR 1550.

Figure 16:
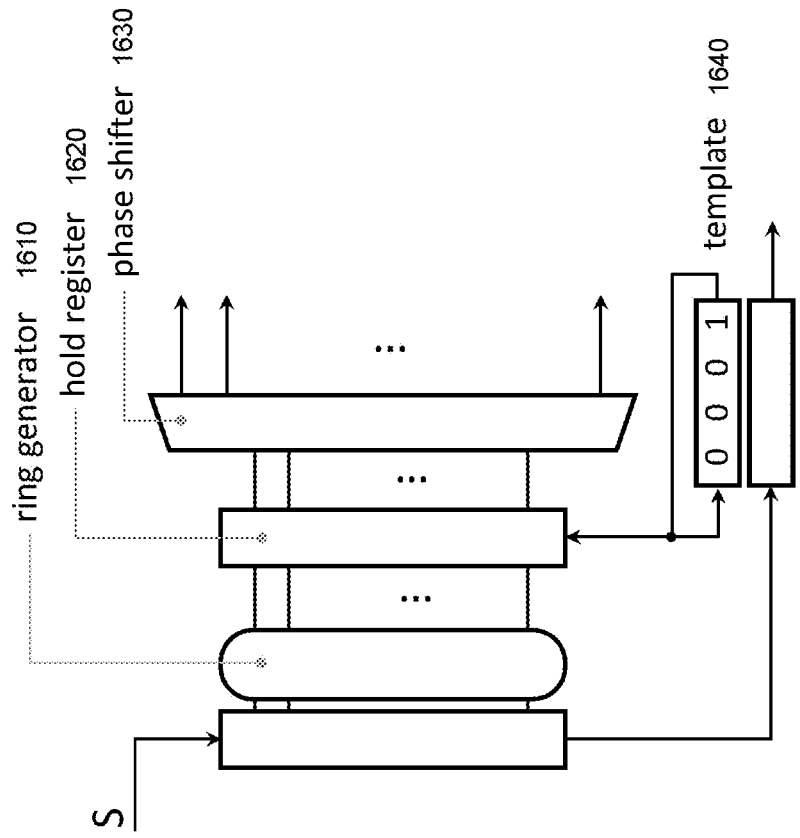
FIG. 16 illustrates an example of architecture of the small decompressor for supplying signals which are used to help produce the control signals.

FIG. 16 illustrates an example of architecture of the small decompressor 1530. Besides a ring generator 1610 and a phase shifter 1630 driving the selector inputs, a hold register 1620 is placed between these two devices. It captures certain states of the ring generator 1610, while the generator 1610 keeps advancing to a next state needed to decode another group of selection bits. As a result, one can repeat and pass on to the selector 1540 a given S-decompressor state for a number of consecutive scan shift cycles. The S-decompressor 1530 houses also a small circular template register 1640 that provides a control bit to the hold register every scan shift cycle to indicate whether this register should be reloaded with the current content of the ring generator 1610. Because of its size, the very same short template is typically used multiple times within duration of the same test pattern.

The S-decompressor 1530 is capable of decoding selection patterns (cubes) with additional reload points occurring as 1 s in the template register 1640 and indicating appropriate times as to when to update the hold register. It is worth noting that, similarly to the EDT-based compression, a selection solver assumes that the same equations are associated with all selection bits covered by a given hold period. As a result, the first selection bit of the period becomes the subject of encoding provided there is at least one specified bit within that period. As indicated by experimental results, up to 50% of specified bits (on average) are typically handled by the constant values of the hold periods rather than a direct encoding, thus ensuring a high encoding efficiency.

CONCLUSION

Having illustrated and described the principles of the disclosed technology, it will be apparent to those skilled in the art that the disclosed embodiments can be modified in arrangement and detail without departing from such principles. In view of the many possible embodiments to which the principles of the disclosed technologies can be applied, it should be recognized that the illustrated embodiments are only preferred examples of the technologies and should not be taken as limiting the scope of the disclosed technology. Rather, the scope of the disclosed technology is defined by the following claims and their equivalents. We therefore claim as our disclosed technology all that comes within the scope and spirit of these claims.

What is claimed is:

1. A circuit, comprising:
scan chains comprising scan cells, the scan chains configured to shift in test patterns, apply the test patterns to the circuit, capture test responses of the circuit, and shift out the test responses;
a test response compactor configured to compact the test responses; and
scan gating devices inserted between outputs of the scan chains and inputs of the test response compactor, the scan gating devices dividing the scan chains into groups of scan chains, each of the scan gating devices receiving signals from outputs of one of the groups of scan chains and operating in either an enabled mode or a disenabled mode based on a first signal,
wherein a portion of a test response of a test pattern outputted from each scan chain coupled to a scan gating device operating in the enabled mode is either blocked, or not blocked, or blocked only at one or more cycles from reaching the test response compactor based on a particular bit of a second signal, at least a portion of the second signal being delivered bit-by-bit continuously when the test response is being shifted out, and
wherein another portion of the test response of the test pattern outputted from all scan chains in each of groups of scan chains coupled to scan gating devices operating in the disenabled mode are either blocked or not blocked from reaching the test response compactor based on a third signal.

2. The circuit recited in claim 1, further comprising:
address converting and decoding circuitry configured to generate the first signal based on an address signal, or a combination of the address signal and a fourth signal, or a combination of the address signal, a fourth signal and a fifth signal, wherein bits of the fourth signal can overwrite bits of the address signal to increase number of the scan gating devices being enabled, and wherein the fifth signal allows an immediate neighbor of a scan gating device to be enabled.

3. The circuit recited in claim 1, further comprising:
a configuration register configured to store the first signal and provide the first signal to the each of the scan gating devices.

4. The circuit recited in claim 1, further comprising:
a selector configured to generate the second signal based on a selection signal and a block-on signal and a block-off signal, wherein the selection signal defines which clock cycles to block, and wherein a combination of the block-on signal and the block-off signal determines which scan chain output to be blocked, to be not blocked, or to be blocked based on the selection signal.

5. The circuit recited in claim 1, further comprising:
a pseudo-random pattern generator configured to generate test patterns; and
a decompressor configured to supply signals, based on which at least the first signal and the second signal are generated.

6. The circuit recited in claim 1, further comprising:
a comparison device configured to compare an output signal from the test response compactor with a reference signal.

7. The circuit recited in claim 1, further comprising:
a decompressor configured to decompress compressed test patterns into the test patterns.

8. The circuit recited in claim 7, wherein the decompressor comprises a ring generator and a phase shifter.

9. The circuit recited in claim 1, wherein a plurality of subunits, each of the subunits comprising a multiplexer and an AND gate for each of the scan chains in the group of scan chains coupled to the each of the scan gating devices.

10. The circuit recited in claim 1, wherein the test response compactor comprises an XOR gate network or an inverter network.

11. One or more non-transitory computer-readable media storing computer-executable instructions for causing a computer to perform a method, the method comprising:
  creating a circuit in a circuit design for testing a chip fabricated according to the circuit design, the circuit comprising:
  scan chains comprising scan cells, the scan chains configured to shift in test patterns, apply the test patterns to the circuit, capture test responses of the circuit, and shift out the test responses;
  a test response compactor configured to compact the test responses; and
  scan gating devices inserted between outputs of the scan chains and inputs of the test response compactor, the scan gating devices dividing the scan chains into groups of scan chains, each of the scan gating devices receiving signals from outputs of one of the groups of scan chains and operating in either an enabled mode or a disenabled mode based on a first signal,
  wherein a portion of a test response of a test pattern outputted from each scan chain coupled to a scan gating device operating in the enabled mode is either blocked, or not blocked, or blocked only at one or more cycles from reaching the test response compactor based on a particular bit of a second signal, at least a portion of the second signal being delivered bit-by-bit continuously when the test response is being shifted out, and
  wherein another portion of the test response of the test pattern outputted from all scan chains in each of groups of scan chains coupled to scan gating devices operating in the disenabled mode are either blocked or not blocked from reaching the test response compactor based on a third signal.

12. The one or more non-transitory computer-readable media recited in claim 11, wherein the circuit further comprises:
  address converting and decoding circuitry configured to generate the first signal based on an address signal, or a combination of the address signal and a fourth signal, or a combination of the address signal, a fourth signal and a fifth signal, wherein bits of the fourth signal can overwrite bits of the address signal to increase number of the scan gating devices being enabled, and wherein the fifth signal allows an immediate neighbor of a scan gating device to be enabled.

13. The one or more non-transitory computer-readable media recited in claim 11, wherein the circuit further comprises:
  a configuration register configured to store the first signal and provide the first signal to the each of the scan gating devices.

14. The one or more non-transitory computer-readable media recited in claim 11, wherein the circuit further comprises:
  a selector configured to generate the second signal based on a selection signal and a block-on signal and a block-off signal, wherein the selection signal defines which clock cycles to block, and wherein a combination of the block-on signal and the block-off signal determines which scan chain output to be blocked, to be not blocked, or to be blocked based on the selection signal.

15. The one or more non-transitory computer-readable media recited in claim 11, wherein the circuit further comprises:
  a pseudo-random pattern generator configured to generate test patterns; and
  a decompressor configured to supply signals, based on which at least the first signal and the second signal are generated.

16. The one or more non-transitory computer-readable media recited in claim 11, wherein the circuit further comprises:
  a comparison device configured to compare an output signal from the test response compactor with a reference signal.

17. The one or more non-transitory computer-readable media recited in claim 11, wherein the circuit further comprises:
  a decompressor configured to decompress compressed test patterns into the test patterns.

18. The one or more non-transitory computer-readable media recited in claim 17, wherein the decompressor comprises a ring generator and a phase shifter.

19. The one or more non-transitory computer-readable media recited in claim 11, wherein a plurality of subunits, each of the subunits comprising a multiplexer and an AND gate for each of the scan chains in the group of scan chains coupled to the each of the scan gating devices.

20. The one or more non-transitory computer-readable media recited in claim 11, wherein the test response compactor comprises an XOR gate network or an inverter network.

* * * * *